(12) United States Patent
Kyogoku et al.

(10) Patent No.: US 11,121,249 B2
(45) Date of Patent: Sep. 14, 2021

(54) SEMICONDUCTOR DEVICE, INVERTER CIRCUIT, DRIVING DEVICE, VEHICLE, AND ELEVATOR

(71) Applicant: KABUSHIKI KAISHA TOSHIBA, Minato-ku (JP)

(72) Inventors: Shinya Kyogoku, Tsukuba (JP); Katsuhisa Tanaka, Tsukuba (JP); Ryosuke Iijima, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/798,814

(22) Filed: Feb. 24, 2020

(65) Prior Publication Data
US 2021/0036149 A1 Feb. 4, 2021

(30) Foreign Application Priority Data
Aug. 2, 2019 (JP) .............................. JP2019-143401

(51) Int. Cl.
| | |
|---|---|
| *H01L 29/78* | (2006.01) |
| *H01L 29/66* | (2006.01) |
| *H01L 29/16* | (2006.01) |
| *B66B 1/30* | (2006.01) |
| *B60L 13/00* | (2006.01) |
| *H02M 7/537* | (2006.01) |
| *B60R 16/03* | (2006.01) |

(52) U.S. Cl.
CPC ........ *H01L 29/7813* (2013.01); *B60L 13/006* (2013.01); *B60R 16/03* (2013.01); *B66B 1/308* (2013.01); *H01L 29/1608* (2013.01); *H01L 29/66734* (2013.01); *H02M 7/537* (2013.01); *B60L 2210/42* (2013.01)

(58) Field of Classification Search
CPC ............ H01L 29/7813; H01L 29/1095; H01L 29/66734; B60L 13/006; B60L 2210/42; B60R 16/03; B66B 1/308; H02M 7/537
USPC .......................................................... 257/77
See application file for complete search history.

(56) References Cited

U.S. PATENT DOCUMENTS

2013/0306983 A1\* 11/2013 Nakano ............... H01L 29/0696
257/76
2018/0025910 A1\* 1/2018 Ohashi ............... H01L 29/1095
257/77

FOREIGN PATENT DOCUMENTS

| JP | 5-335569 A | 12/1993 |
|---|---|---|
| JP | 2005-116985 A | 4/2005 |

(Continued)

*Primary Examiner* — Igwe U Anya
(74) *Attorney, Agent, or Firm* — Oblon, McClelland, Maier & Neustadt, L.L.P.

(57) ABSTRACT

A semiconductor device of an embodiment includes a silicon carbide layer having a first plane and a second plane and includes a trench located on a first plane side and has a first region and a second region, a first silicon carbide region of an n-type, a second silicon carbide region of a p-type between the first silicon carbide region and the first plane, a third silicon carbide region of the n-type between the second silicon carbide region and the first plane, and a fourth silicon carbide region of the p-type between the second region and the first silicon carbide region; a gate electrode in the first region; a first electrode on the first plane side of the silicon carbide layer, a part of the first electrode is located in the second region and is in contact with the third and the fourth silicon carbide region; and a second electrode.

14 Claims, 28 Drawing Sheets

(56) References Cited

FOREIGN PATENT DOCUMENTS

| | | | |
|---|---|---|---|
| JP | 2010-258387 | A | 11/2010 |
| JP | 6090805 | B2 | 3/2017 |

* cited by examiner

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2019-143401, filed on Aug. 2, 2019, the entire contents of which are incorporated herein by reference.

FIELD

Embodiments described herein relate generally to a semiconductor device, an inverter circuit, a driving device, a vehicle and an elevator.

BACKGROUND

Silicon carbide (SiC) is expected to be a material of next-generation semiconductor devices. Silicon carbide has excellent physical properties such as a band gap of about three times, a breakdown field strength of about ten times, and a thermal conductivity of about three times higher those of silicon. By utilizing these physical properties, it is possible to realize a semiconductor device capable of operating at high temperature with low loss.

A trench gate structure, in which a gate electrode is provided in a trench, is applied to a vertical metal oxide semiconductor field effect transistor (MOSFET) in order to realize a low on-resistance. The application of the trench gate structure increases a channel area per unit area and reduces the on-resistance.

DETAILED DESCRIPTION

Figure 1:
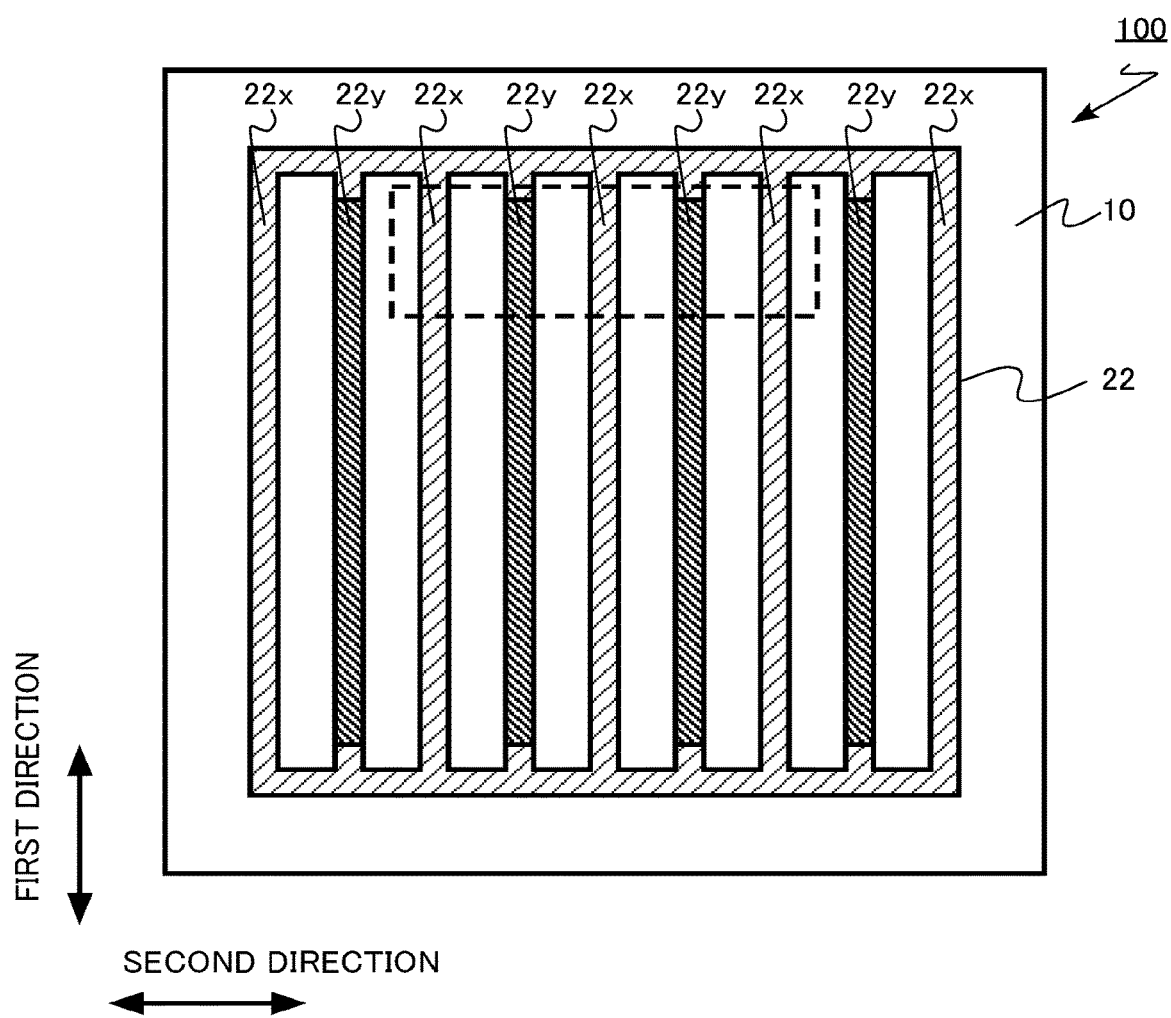
FIG. 1 is a schematic plan view of a semiconductor device of a first embodiment.

A semiconductor device of an embodiment includes: a silicon carbide layer having a first plane and a second plane, the first plane being parallel to a first direction and a second direction intersecting the first direction, and the second plane being parallel to the first direction and the second direction and facing the first plane, the silicon carbide layer comprising: a trench located on a first plane side, the trench having a first region and a second region; a first silicon carbide region of an n-type; a second silicon carbide region of a p-type located between the first silicon carbide region and the first plane; a third silicon carbide region of the n-type located between the second silicon carbide region and the first plane; and a fourth silicon carbide region of the p-type located between the second region and the first silicon carbide region, the fourth silicon carbide region having p-type impurity concentration higher than p-type impurity concentration in the second silicon carbide region; a gate electrode located in the first region; a gate insulating layer located between the gate electrode and the silicon carbide layer; a first electrode located on the first plane side of the silicon carbide layer, a part of the first electrode being located in the second region, and the part of the first electrode being in contact with the third silicon carbide region and the fourth silicon carbide region; and a second electrode located on a second plane side of the silicon carbide layer.

Hereinafter, embodiments of the present disclosure will be described with reference to the drawings. Note that the same or similar members and the like are denoted by the same reference signs in the following description, and the descriptions of members and the like once explained are omitted as appropriate.

Moreover, when the notations of $n^+$, n and $n^-$ and of $p^+$, p and $p^-$ are used in the following description, these notations represent relative levels of the impurity concentrations in each conductivity type. That is, $n^+$ indicates that the n-type impurity concentration is relatively higher than n, and $n^-$ indicates that the n-type impurity concentration is relatively lower than n. Furthermore, $p^+$ indicates that the p-type impurity concentration is relatively higher than p, and $p^-$ indicates that the p-type impurity concentration is relatively lower than p. Note that, in some cases, an $n^+$-type and $n^-$-type are simply referred to as an n-type, and $p^+$-type and $p^-$-type are simply referred to as a p-type.

The impurity concentration can be measured, for example, by secondary ion mass spectrometry (SIMS). In addition, the relative level of the impurity concentration can be determined, for example, from the level of the carrier concentration obtained by scanning capacitance microscopy (SCM). Moreover, a distance such as a width or depth of an impurity region can be obtained, for example, by SIMS. The distance such as a width or depth of the impurity region can be also be obtained, for example, from an SCM image.

The depth of a trench, the thickness of an insulating layer, and the like can be measured, for example, by SIMS or on a transmission electron microscope (TEM) image.

Note that, in this specification, the "p-type impurity concentration" in a silicon carbide region of a p-type means the net p-type impurity concentration obtained by subtracting the n-type impurity concentration in the region from the p-type impurity concentration in the region. Moreover, the "n-type impurity concentration" in a silicon carbide region of an n-type means the net n-type impurity concentration obtained by subtracting the p-type impurity concentration in the region from the n-type impurity concentration in the region.

Furthermore, in this specification, the impurity concentration in the silicon carbide region is represented by the maximum impurity concentration in the region.

(First Embodiment)

A semiconductor device of a first embodiment includes a silicon carbide layer having a first plane and a second plane, the first plane being parallel to a first direction and a second direction intersecting the first direction, and the second plane being parallel to the first direction and the second direction and facing the first plane, the silicon carbide layer comprising: a trench located on a first plane side, the trench having a first region and a second region; a first silicon carbide region of an n-type; a second silicon carbide region of a p-type located between the first silicon carbide region and the first plane; a third silicon carbide region of the n-type located between the second silicon carbide region and the first plane; and a fourth silicon carbide region of the p-type located between the second region and the first silicon carbide region, the fourth silicon carbide region having p-type impurity concentration higher than p-type impurity concentration in the second silicon carbide region; a gate electrode located in the first region; a gate insulating layer located between the gate electrode and the silicon carbide layer; a first electrode located on the first plane side of the silicon carbide layer, a part of the first electrode being located in the second region, and the part of the first electrode being in contact with the third silicon carbide region and the fourth silicon carbide region; and a second electrode located on a second plane side of the silicon carbide layer.

The semiconductor device of the first embodiment is a vertical MOSFET 100 using silicon carbide. The MOSFET 100 is a MOSFET having a trench gate structure in which the gate electrode is provided in the trench. The MOSFET 100 is a MOSFET having a so-called double trench structure in which a source electrode is also provided in the trench. Moreover, the MOSFET 100 is an n-channel MOSFET using electrons as carriers.

FIG. 1 is a schematic plan view of the semiconductor device of the first embodiment. FIG. 1 is an explanatory diagram of a trench pattern of the semiconductor device of the first embodiment.

Figure 2:
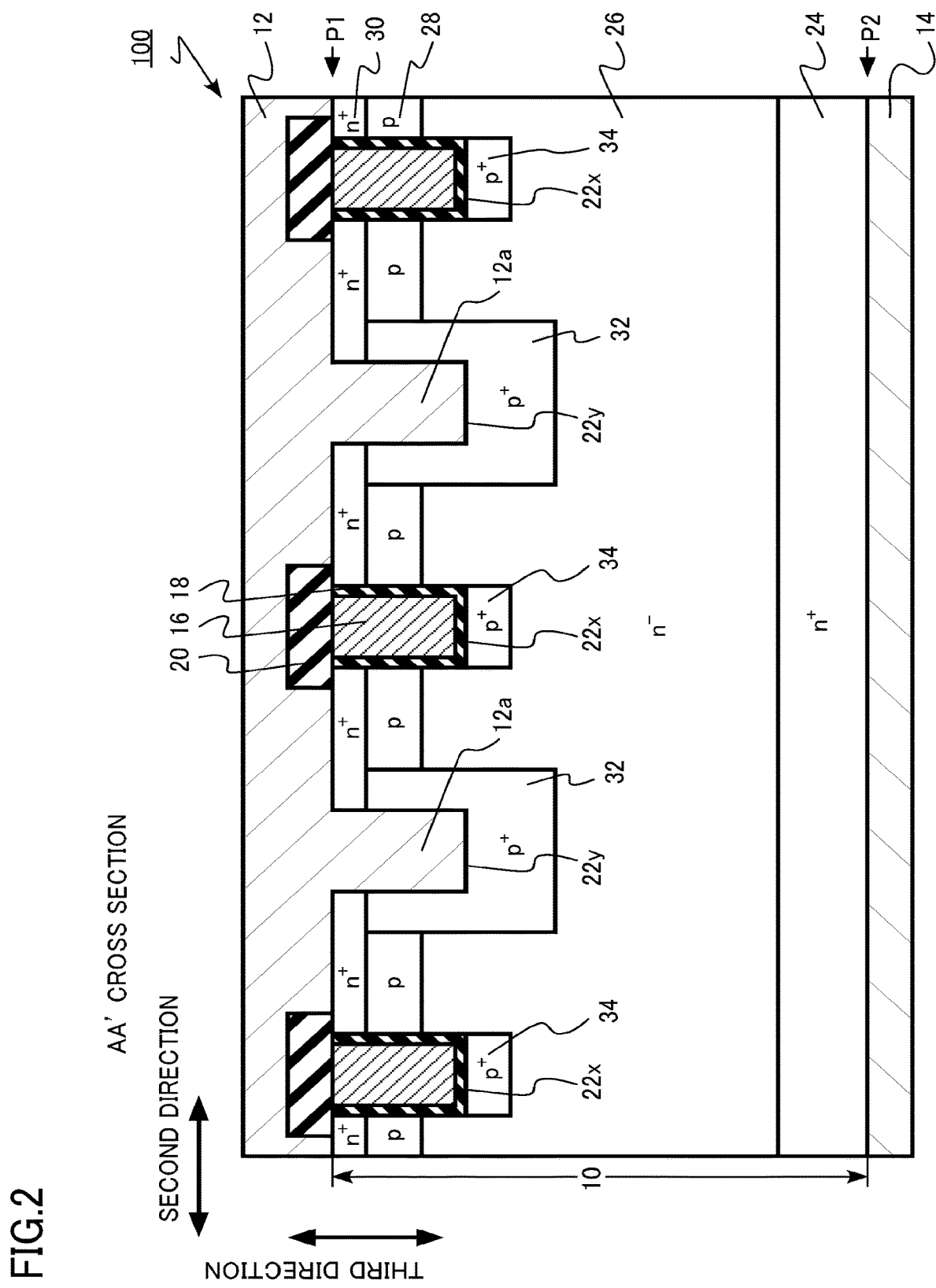
FIG. 2 is a schematic cross-sectional view of the semiconductor device of the first embodiment.
Figure 3:
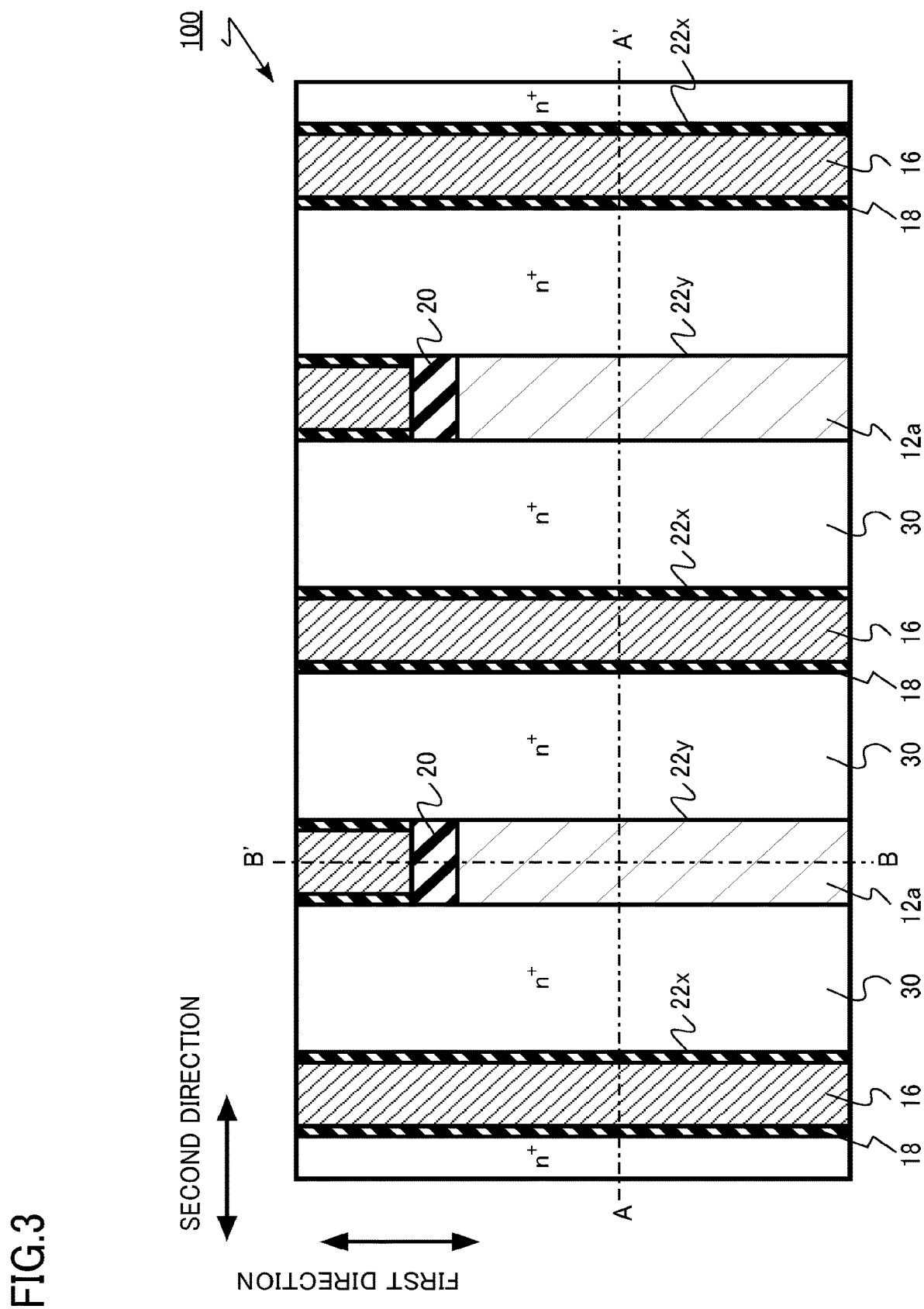
FIG. 3 is a schematic plan view of the semiconductor device of the first embodiment.
Figure 4:
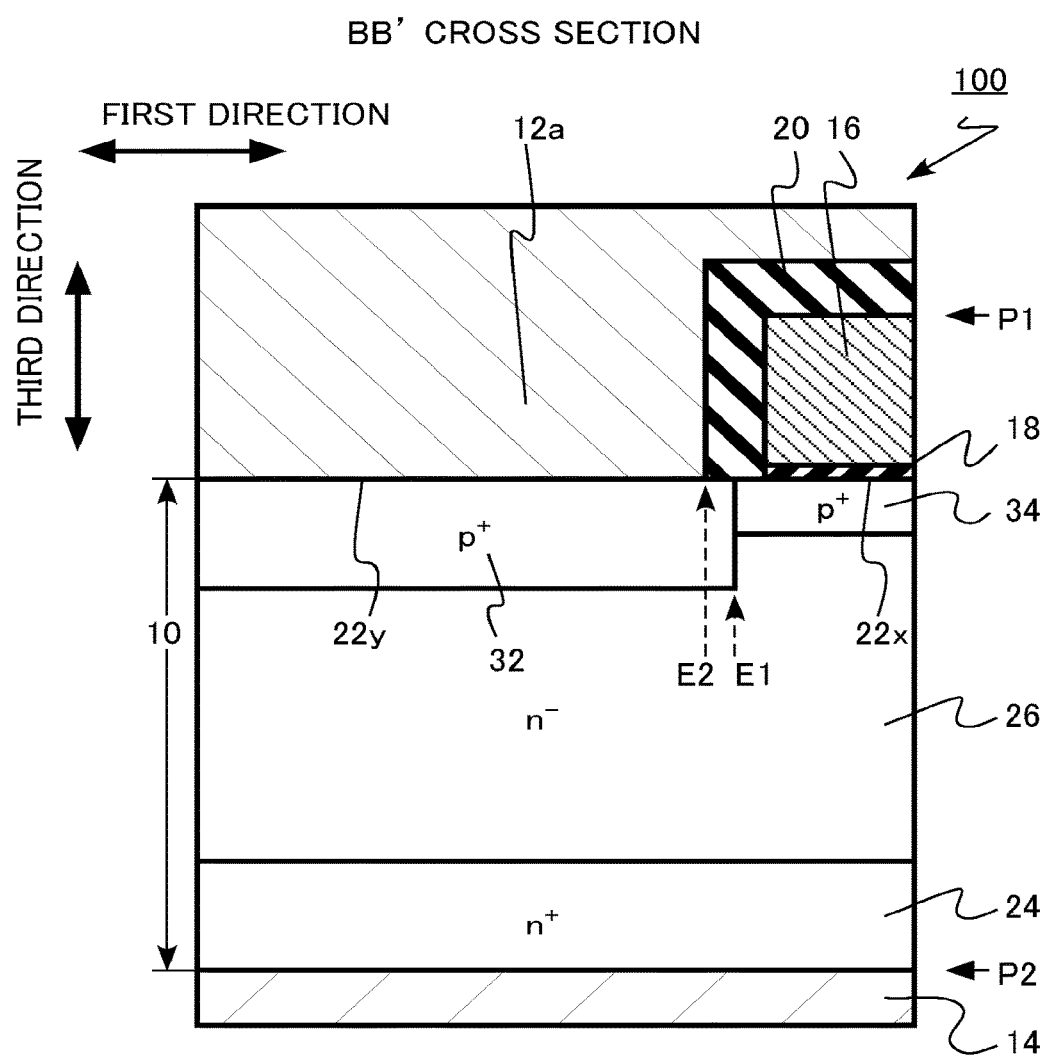
FIG. 4 is a schematic cross-sectional view of the semiconductor device of the first embodiment.

FIG. 2 is a schematic cross-sectional view of the semiconductor device of the first embodiment. FIG. 3 is a schematic plan view of the semiconductor device of the first embodiment. FIG. 4 is a schematic cross-sectional view of the semiconductor device of the first embodiment.

FIGS. 2, 3 and 4 are cross-sectional views or a plan view of a region indicated by the broken line in FIG. 1. FIGS. 1 and 3 are plan views of a first plane (P1 in FIG. 2) in FIG. 2. FIG. 2 is a cross-sectional view taken along the line AA' in FIG. 3. FIG. 4 is a cross-sectional view taken along the line BB' in FIG. 3.

The MOSFET 100 includes a silicon carbide layer 10, a source electrode 12 (first electrode), a drain electrode (second electrode), a gate electrode 16, a gate insulating layer 18 and an interlayer insulating layer 20.

The silicon carbide layer 10 has a trench 22, a drain region 24 of an $n^+$-type, a drift region 26 (first silicon carbide region) of an $n^-$-type, a body region 28 (second silicon carbide region) of a p-type, a source region 30 (third silicon carbide region) of the $n^+$-type, a field limiting region 32 (fourth silicon carbide region) of a $p^+$-type and a gate trench bottom region 34 (fifth silicon carbide region) of the $p^+$-type.

The trench 22 has a gate trench region 22x (first region) and a contact trench region 22y (second region). The source electrode 12 includes a contact region 12a (part) which is a part thereof.

The silicon carbide layer 10 is located between the source electrode 12 and the drain electrode 14. The silicon carbide layer 10 includes a first plane ("P1" in FIG. 2) and a second plane ("P2" in FIG. 2). Hereinafter, the first plane P1 is also referred to as a front face, and the second plane P2 is also referred to as a back face. The second plane P2 faces the first plane P1.

A first direction and a second direction are directions parallel to the first plane P1. The second direction is also a direction that intersects the first direction. The second direction is, for example, a direction perpendicular to the first direction. Moreover, a third direction is a direction perpendicular to the first plane P1. The third direction is a direction perpendicular to the first direction and the second direction.

Hereinafter, "depth" means a depth based on the first plane P1.

The silicon carbide layer 10 is single crystal SiC. The silicon carbide layer 10 is, for example, 4H-SiC. The thickness of the silicon carbide layer 10 is, for example, not less than 5 μm and not more than 500 μm.

The first plane P1 is, for example, a plane tilted by not less than zero degrees and not more than eight degrees from a (0001) face. That is, the first plane P1 is a plane whose normal line is tilted by not less than zero degrees and not more than eight degrees from the c-axis in the [0001] direction. In other words, the off angle from the (0001) face is not less than zero degrees and not more than eight degrees. In addition, the second plane P2 is, for example, a plane tilted by not less than zero degrees and not more than eight degrees from a (000-1) face.

The (0001) face is referred to as a silicon face. The (000-1) face is referred to as a carbon face. The tilting direction of the first plane P1 and the second plane P2 is, for example, a [11-20] direction. The [11-20] direction is an a-axis direction. For example, the second direction in FIG. 2 is the a-axis direction.

The trench 22 exists in the silicon carbide layer 10. The trench 22 is located on the first plane P1 side of the silicon carbide layer 10. The trench 22 is a groove formed in the silicon carbide layer 10.

The trench 22 extends in the first direction as shown in FIGS. 1 and 3. The trench 22 is shaped in stripe as shown in FIGS. 1 and 3.

The trench 22 is repeatedly disposed in the second direction as shown in FIGS. 1 and 3. The repetition pitch of the trench 22 in the second direction is, for example, not less than 1 μm and not more than 5 μm. The depth of the trench 22 is, for example, not less than 1 μm and not more than 2 μm. The width of the trench 22 in the second direction is, for example, not less than 0.5 μm and not more than 1 μm.

As shown in FIGS. 1, 2, 3 and 4, the trench 22 has the gate trench region 22x (first region) and the contact trench region 22y (second region). The gate electrode 16 is located in the gate trench region 22x. The gate insulating layer 18 is located between the gate electrode 16 and the silicon carbide layer 10. The contact region 12a (part), which is a part of the source electrode 12, is located in the contact trench region 22y.

The gate trench region 22x and the contact trench region 22y are simultaneously formed in the silicon carbide layer 10. The gate trench region 22x and the contact trench region 22y are continuous. The gate trench region 22x and the contact trench region 22y are parts of the same trench 22.

The distance between the second plane P2 and the gate trench region 22x and the distance between the second plane P2 and the contact trench region 22y are substantially the same. That is, the depth of the gate trench region 22x and the depth of the contact trench region 22y are substantially the same.

The gate trench region 22x and the contact trench region 22y penetrate the source region 30. The gate trench region 22x and the contact trench region 22y penetrate the body region 28.

As shown in FIGS. 1 and 3, at least a part of the gate trench region 22x extends in the first direction, and at least a part of the contact trench region 22y extends in the first direction. The body region 28 is located between at least a part of the gate trench region 22x and at least a part of the contact trench region 22y.

The gate electrode 16 is located in the gate trench region 22x. The gate electrode 16 is provided between the source electrode 12 and the drain electrode 14. The gate electrode 16 extends in the first direction.

The gate electrode 16 is a conductive layer. The gate electrode 16 is, for example, polycrystalline silicon containing a p-type impurity or an n-type impurity.

The gate insulating layer 18 is located between the gate electrode 16 and the silicon carbide layer 10. The gate insulating layer 18 is provided between the gate electrode 16 and the source region 30, the body region 28 and the gate trench bottom region 34.

The gate insulating layer 18 is, for example, a silicon oxide film. For example, a high-k insulating film (high dielectric constant insulating film such as HfSiON, ZrSiON or AlON) can be applied to the gate insulating layer 18. Moreover, for example, a stacked film of a silicon oxide film ($SiO_2$) and a high-k insulating film can also be applied to the gate insulating layer 18.

The interlayer insulating layer 20 is provided on the gate electrode 16. The interlayer insulating layer 20 is provided between the gate electrode 16 and the source electrode 12. The interlayer insulating layer 20 is provided between the gate electrode 16 and the contact region 12a located in the trench 22. The thickness of the interlayer insulating layer 20 is thicker than the thickness of the gate insulating layer 18. The interlayer insulating layer 20 is, for example, a silicon oxide film. The interlayer insulating layer 20 electrically separates the gate electrode 16 and the source electrode 12.

The source electrode 12 is located on the first plane P1 side of the silicon carbide layer 10. The source electrode 12 is provided on the first plane P1 of the silicon carbide layer 10. The source electrode 12 is in contact with the source region 30 and the field limiting region 32. The contact region 12a, which is a part of the source electrode 12, is located in the contact trench region 22y. The contact region 12a is in contact with the source region 30 and the field limiting region 32.

The source electrode 12 contains metal. The metal forming the source electrode 12 has, for example, a stacked structure of titanium (Ti) and aluminum (Al). The source electrode 12 may include metal silicide or metal carbide in contact with the silicon carbide layer 10.

The drain electrode 14 is located on the second plane P2 side of the silicon carbide layer 10. The drain electrode 14 is provided on the second plane P2 of the silicon carbide layer 10. The drain electrode 14 is in contact with the drain region 24.

The drain electrode 14 is, for example, a metal or metal semiconductor compound. The drain electrode 14 contains, for example, a material selected from the group consisting of nickel silicide (NiSi), titanium (Ti), nickel (Ni), silver (Ag) and gold (Au).

The drain region 24 of the $n^+$-type is provided on the second plane P2 side of the silicon carbide layer 10. The drain region 24 contains, for example, nitrogen (N) as an n-type impurity. The n-type impurity concentration in the drain region 24 is, for example, not less than $1\times10^{18}$ $cm^{-3}$ and not more than $1\times10^{21}$ $cm^{-3}$.

The drift region 26 of the $n^-$-type is provided on the drain region 24. The drift region 26 is located between the first plane P1 and the drain region 24.

The drift region 26 contains, for example, nitrogen (N) as an n-type impurity. The n-type impurity concentration in the drift region 26 is, for example, not less than $4\times10^{14}$ $cm^3$ and not more than $1\times10^{18}$ $cm^{-3}$.

The body region 28 of the p-type is located between the drift region 26 and the first plane P1. The body region 28 functions as a channel region of the MOSFET 100. For example, when MOSFET 100 is turned on, a channel through which electrons flow is formed in a region of the body region 28 in contact with the gate insulating layer 18. The region of the body region 28 in contact with the gate insulating layer 18 becomes a channel formation region.

The body region 28 contains, for example, aluminum (Al) as a p-type impurity. The impurity concentration of the p-type impurity in the body region 28 is, for example, not less than $5\times10^{16}$ $cm^{-3}$ and not more than $5\times10^{17}$ $cm^{-3}$.

The depth of the body region 28 is shallower than the depth of the trench 22. The depth of the body region 28 is, for example, not less than 0.2 μm and not more than 1.0 μm.

The source region 30 of the n+-type is located between the body region 28 and the first plane P1. The source region 30 is in contact with the source electrode 12. The source region 30 is in contact with the gate insulating layer 18.

The source region 30 contains, for example, phosphorus (P) as an n-type impurity. The n-type impurity concentration in the source region 30 is higher than the n-type impurity concentration in the drift region 26. The n-type impurity concentration in the source region 30 is, for example, not less than $1 \times 10^{19}$ cm$^{-3}$ and not more than $1 \times 10^{21}$ cm$^{-3}$.

The depth of the source region 30 is shallower than the depth of the body region 28. The depth of the source region 30 is, for example, not less than 0.1 μm and not more than 0.3 μm.

The field limiting region 32 of the p'-type is located between the contact trench region 22y and the drift region 26. The field limiting region 32 is in contact with the bottom face of the contact trench region 22y. The field limiting region 32 is in contact with the contact region 12a of the source electrode 12.

The field limiting region 32 is located, for example, between the contact trench region 22y and the body region 28. The field limiting region 32 is in contact with, for example, the side faces of the contact trench region 22y.

The field limiting region 32 has a function of limiting the electric field applied to the gate insulating layer 18 when the MOSFET 100 is turned off. For example, the field limiting region 32 is fixed at the same electric potential as the source electrode 12.

The field limiting region 32 contains, for example, aluminum (Al) as a p-type impurity. The p-type impurity concentration in the field limiting region 32 is higher than the p-type impurity concentration in the body region 28. The p-type impurity concentration in the field limiting region 32 is, for example, ten times higher than the p-type impurity concentration in the body region 28 or more. The p-type impurity concentration in the field limiting region 32 is, for example, not less than $5 \times 10^{17}$ cm$^{-3}$ and not more than $5 \times 10^{20}$ cm$^{-3}$.

The gate trench bottom region 34 of the p+-type is located between the gate trench region 22x and the drift region 26. The gate trench bottom region 34 is in contact with the bottom face of the gate trench region 22x. The gate trench bottom region 34 is in contact with the gate insulating layer 18.

As shown in FIG. 4, the gate trench bottom region 34 is in contact with the field limiting region 32 at the bottom of the trench 22. The gate trench bottom region 34 and the field limiting region 32 are in contact with each other at the boundary between the gate trench region 22x and the contact trench region 22y.

As shown in FIG. 4, an end (E1 in FIG. 4) of the field limiting region 32 in the first direction is, for example, located closer to the gate electrode 16 than an end (E2 in FIG. 4) of the contact region 12a in the first direction.

The distance between the second plane P2 and the gate trench bottom region 34 is longer than, for example, the distance between the second plane P2 and the field limiting region 32. In other words, for example, the depth of the field limiting region 32 is deeper than the depth of the gate trench bottom region 34.

The gate trench bottom region 34 has a function of limiting the electric field applied to the gate insulating layer 18 when the MOSFET 100 is turned off. For example, the gate trench bottom region 34 is fixed at the same electric potential as the source electrode 12 via the field limiting region 32.

The gate trench bottom region 34 contains, for example, aluminum (Al) as a p-type impurity. The p-type impurity concentration in the gate trench bottom region 34 is higher than, for example, the p-type impurity concentration in the body region 28. The p-type impurity concentration in the gate trench bottom region 34 is, for example, ten times higher than the p-type impurity concentration in the body region 28 or more.

The p-type impurity concentration in the gate trench bottom region 34 is, for example, lower than the p-type impurity concentration in the field limiting region 32. The p-type impurity concentration in the gate trench bottom region 34 is, for example, not less than $5 \times 10^{17}$ cm$^{-3}$ and not more than $5 \times 10^{19}$ cm$^3$.

As shown in FIG. 4, the gate electrode 16 and the contact region 12a are provided adjacent to each other in the first direction in the trench 22. The interlayer insulating layer 20 is sandwiched between the gate electrode 16 and the contact region 12a. The interlayer insulating layer 20 is located between the gate electrode 16 and the contact region 12a in the trench 22. The thickness of the interlayer insulating layer 20 in the first direction is thicker than the thickness of the gate insulating layer 18 in the third direction.

Next, an example of a manufacturing method of the semiconductor device of the first embodiment will be described.

FIGS. 5, 6, 7, 8, 9, 10 and 11 are schematic cross-sectional views showing an example of the manufacturing method of the semiconductor device of the first embodiment. FIGS. 5, 6, 7, 8, 9, 10 and 11 show cross sections corresponding to FIG. 2.

Figure 5:
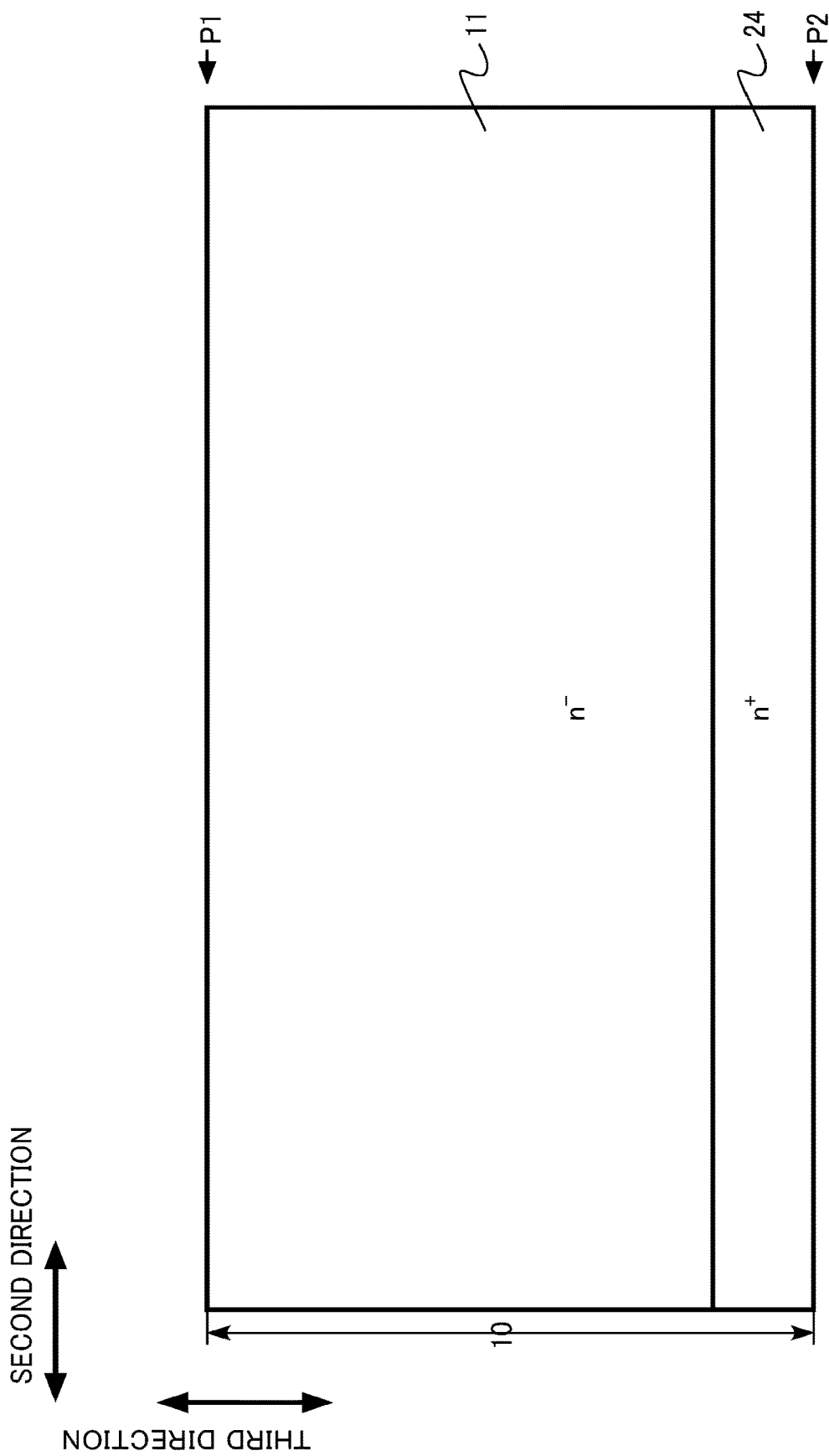
FIG. 5 is a schematic cross-sectional view showing an example of a manufacturing method of the semiconductor device of the first embodiment.

First, the silicon carbide layer 10, which has the drain region 24 of the n+-type and an epitaxial layer 11 of the n−-type formed by epitaxial growth on the drain region 24, is prepared (FIG. 5). A part of the epitaxial layer becomes the drift region 26 at the end.

Figure 6:
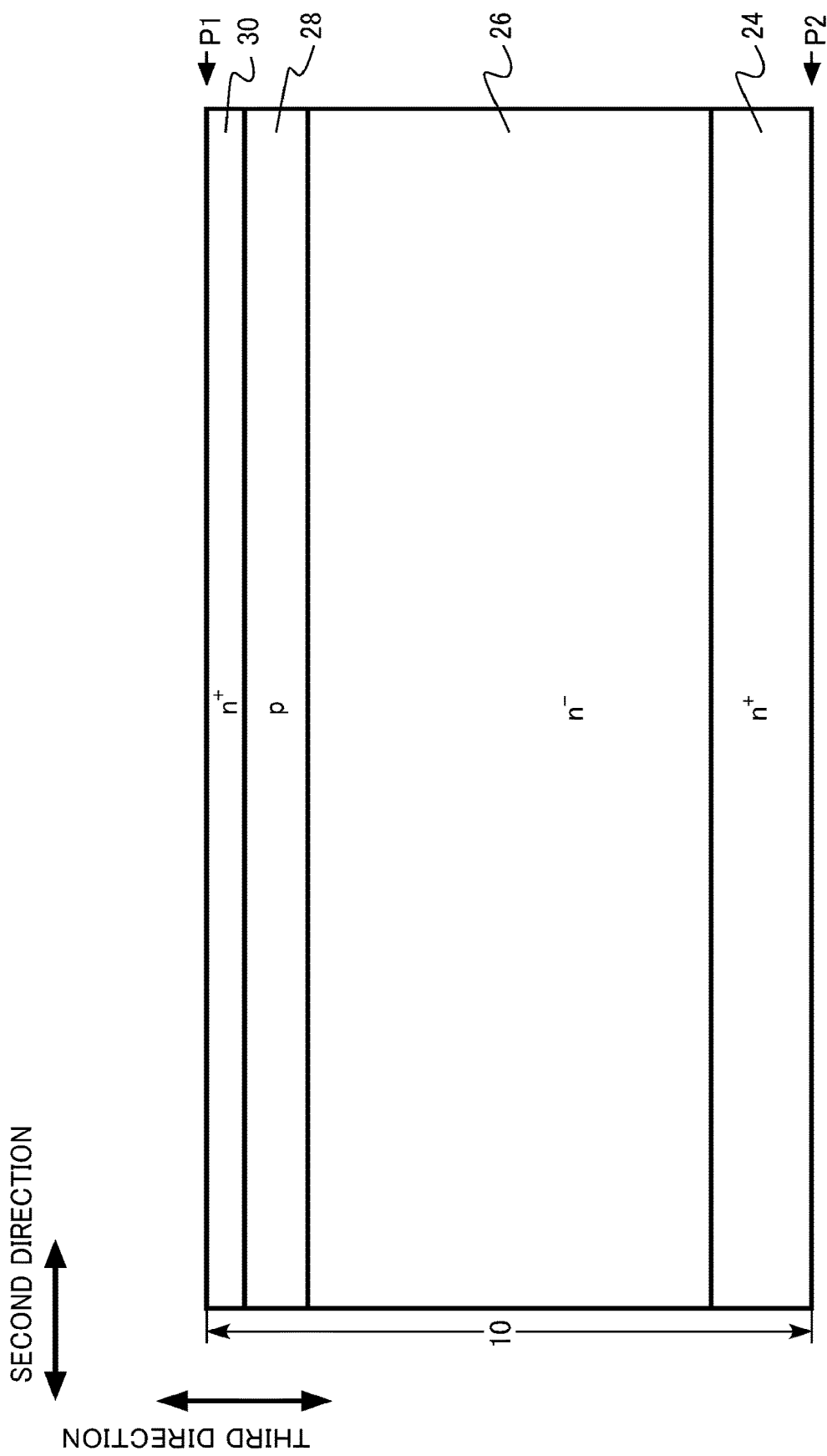
FIG. 6 is a schematic cross-sectional view showing the example of the manufacturing method of the semiconductor device of the first embodiment.

Next, the body region 28 of the p-type and the source region 30 of the n+-type are formed in the epitaxial layer 11 by an ion implantation method (FIG. 6).

Next, a mask material 50 is formed on the front face of the silicon carbide layer 10 by using a known process technique. The mask material 50 is, for example, a silicon oxide film.

Figure 7:
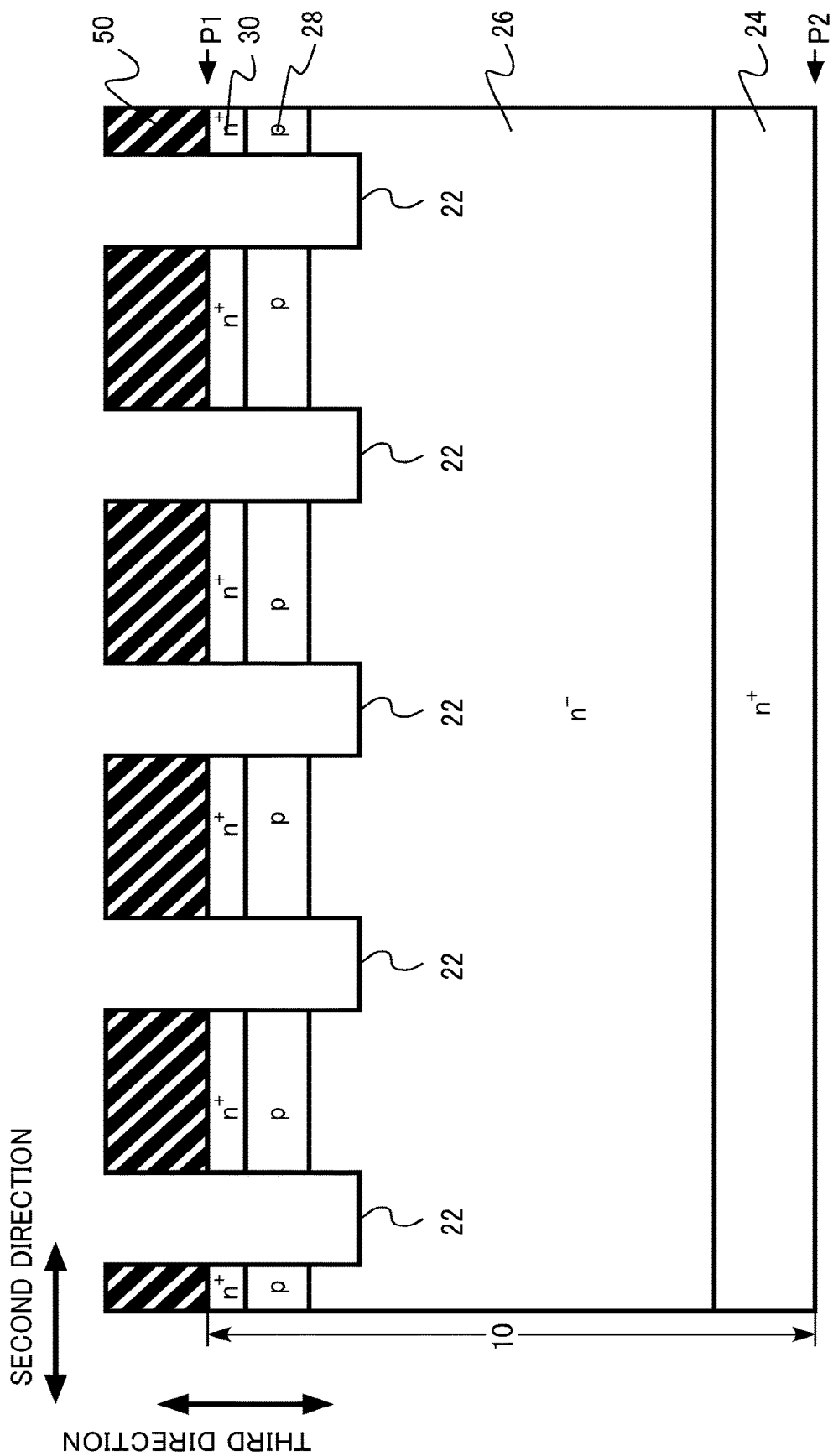
FIG. 7 is a schematic cross-sectional view showing the example of the manufacturing method of the semiconductor device of the first embodiment.

Next, the trench 22 is formed by using a known reactive ion etching method with the mask material 50 serving as a mask (FIG. 7). The trench 22 is formed so as to penetrate the source region 30 and the body region 28.

Figure 8:
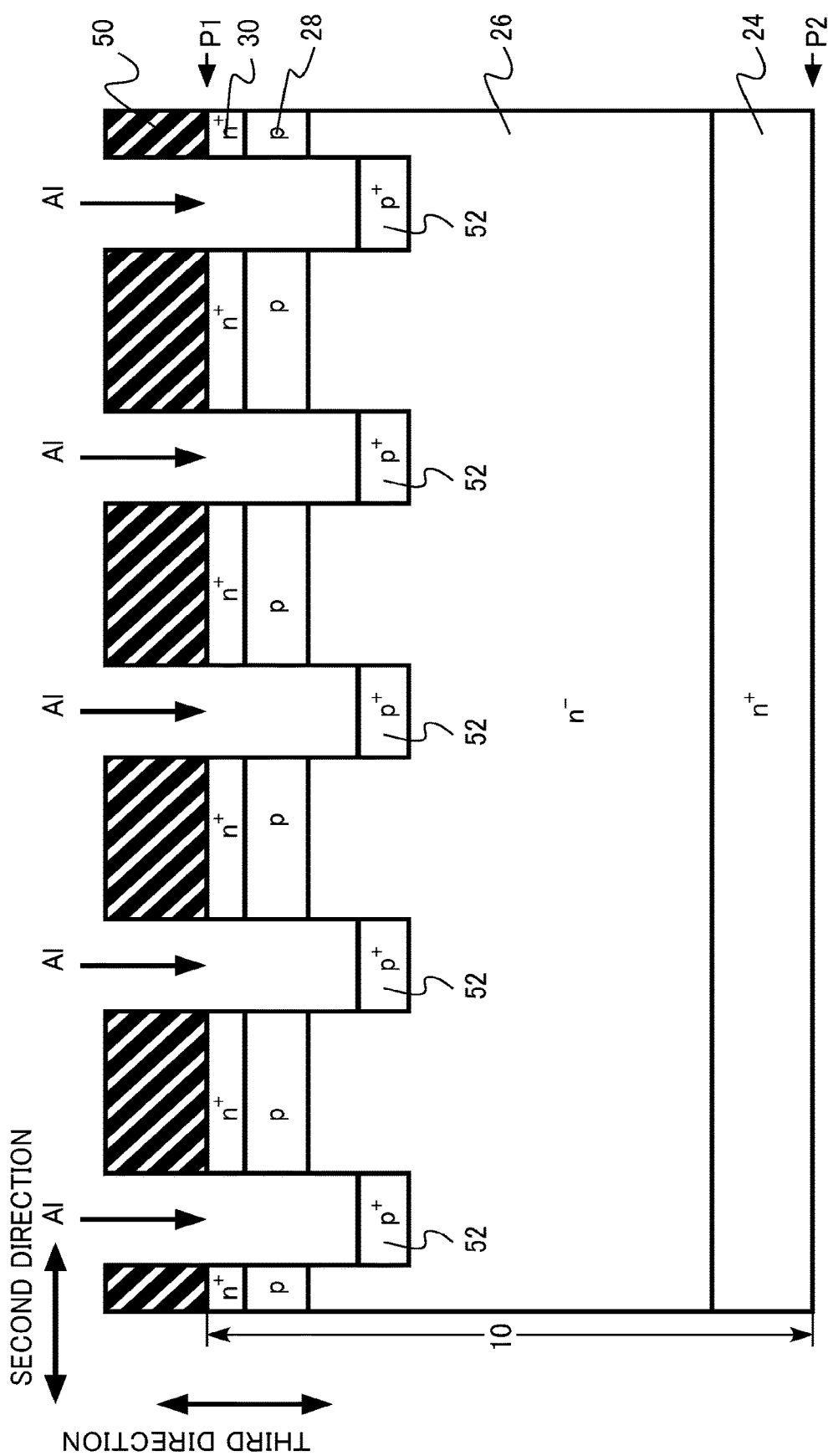
FIG. 8 is a schematic cross-sectional view showing the example of the manufacturing method of the semiconductor device of the first embodiment.

Next, with the mask material 50 serving as a mask, aluminum ions are implanted by an ion implantation method to form a region 52 of the p+-type at the bottom of the trench 22 (FIG. 8). The region 52 of the p+-type becomes the gate trench bottom region 34 of the p+-type and a part of the field limiting region 32 of the p+-type at the end.

Next, the mask material 50 is removed. Next, a mask material 54 is formed on the front face of the silicon carbide layer 10 by using a known process technique. The mask material 54 covers a part of the trench 22. The mask material 54 is, for example, a photoresist.

Figure 9:
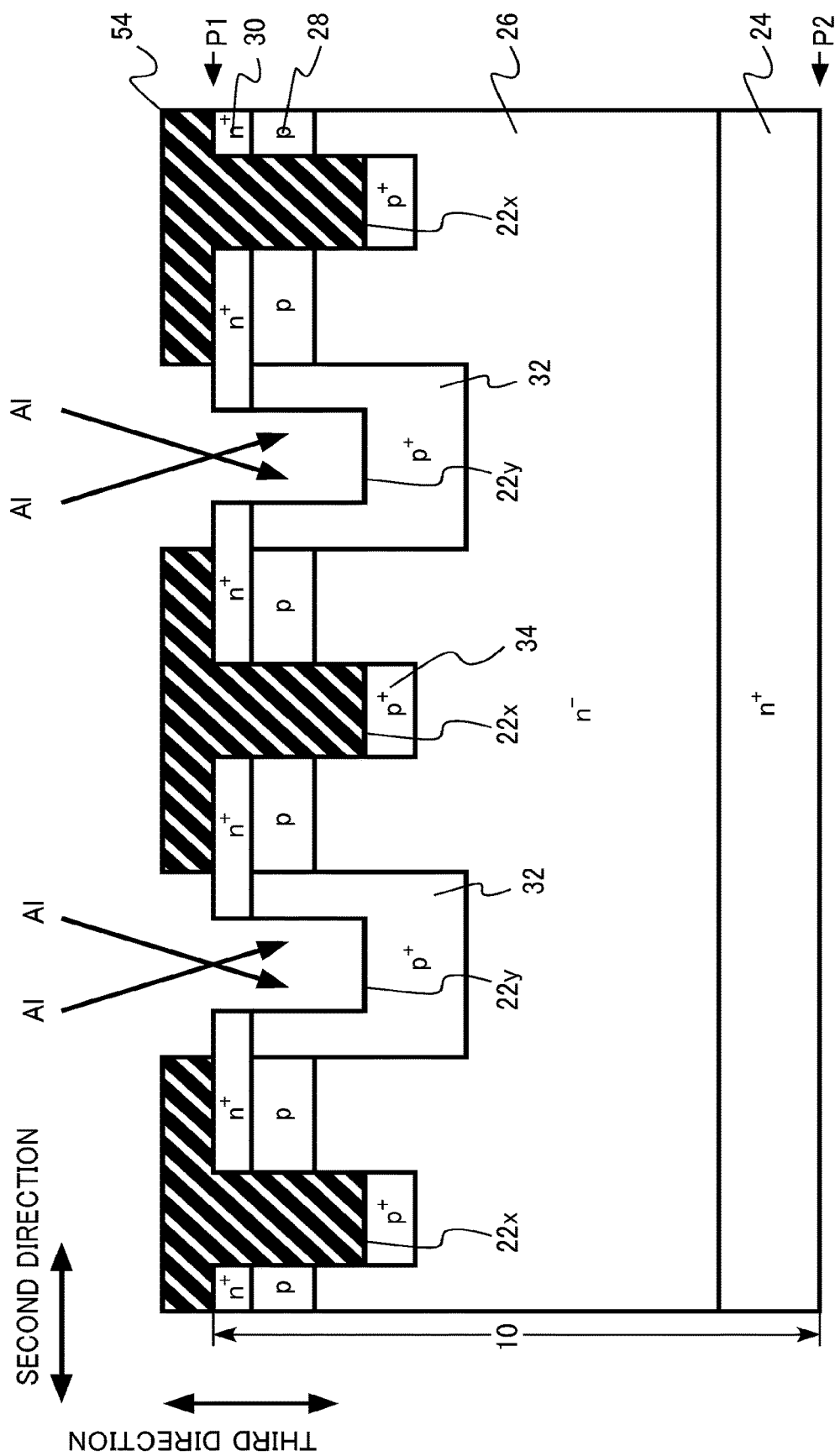
FIG. 9 is a schematic cross-sectional view showing the example of the manufacturing method of the semiconductor device of the first embodiment.

Next, with the mask material 54 serving as a mask, aluminum ions are implanted by an oblique ion implantation method to form the field limiting region 32 of the p+-type (FIG. 9). A portion of the trench 22 where the field limiting region 32 is formed becomes the contact trench region 22y, and a portion of the trench 22 where the field limiting region 32 is not formed becomes the gate trench region 22x. The gate trench bottom region 34 is formed at the bottom of the gate trench region 22x.

Figure 10:
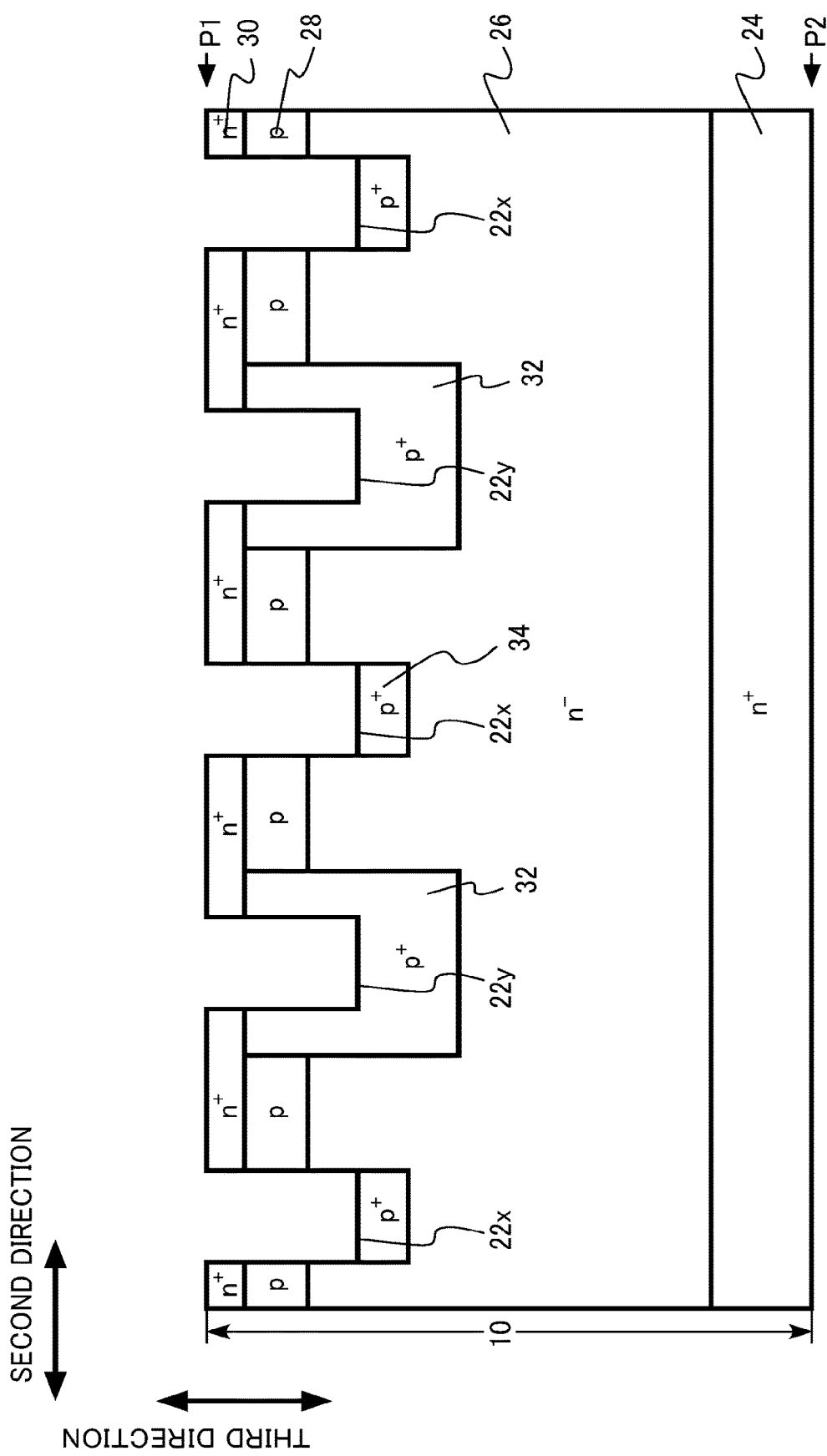
FIG. 10 is a schematic cross-sectional view showing the example of the manufacturing method of the semiconductor device of the first embodiment.

Next, the mask material 54 is removed (FIG. 10).

Figure 11:
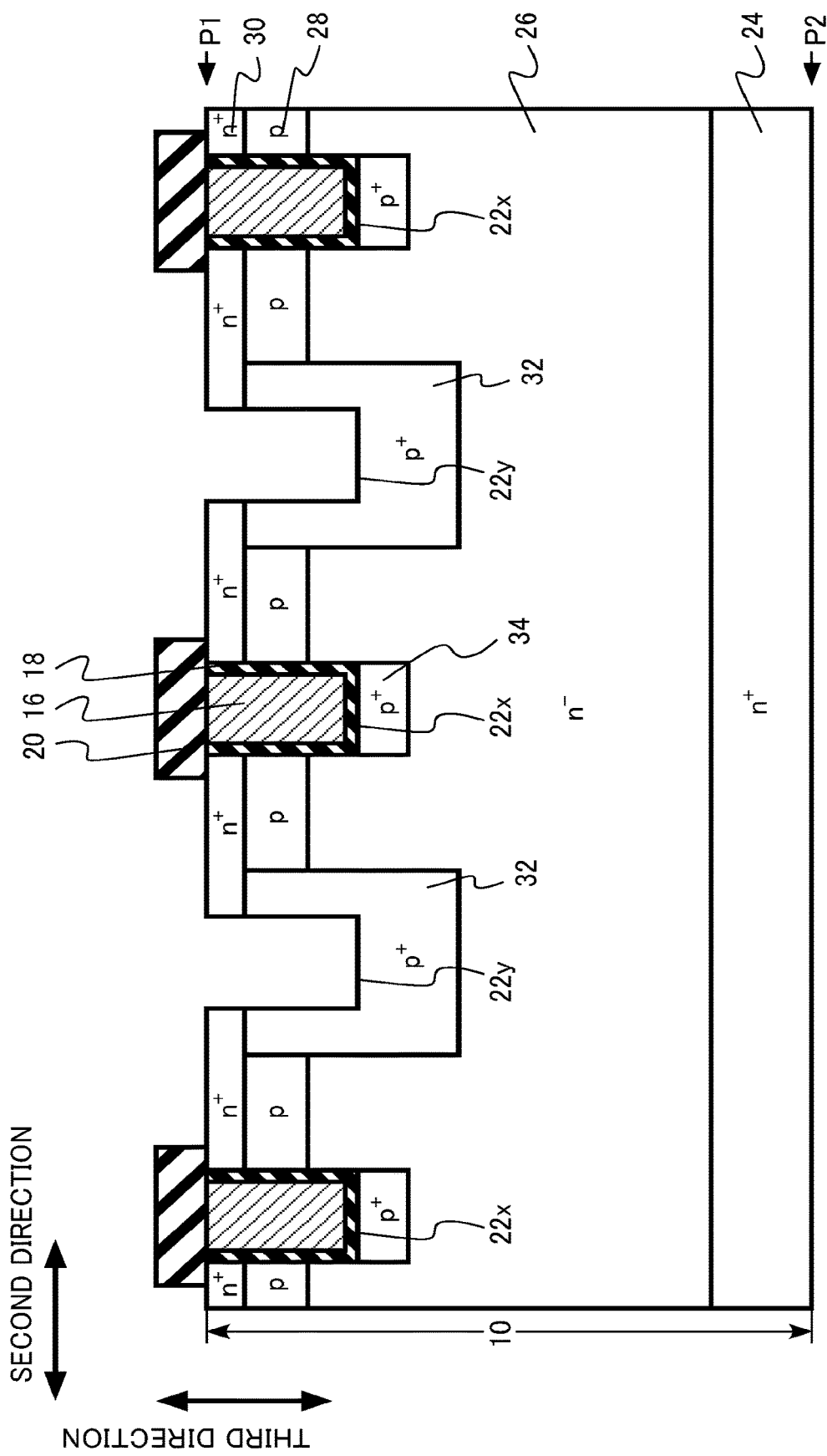
FIG. 11 is a schematic cross-sectional view showing the example of the manufacturing method of the semiconductor device of the first embodiment.

Next, the gate insulating layer 18 and the gate electrode 16 are formed in the gate trench region 22x by using a known process technique. Moreover, the interlayer insulating layer 20 is formed on the gate electrode 16 by using a known process technique (FIG. 11).

The source electrode 12 and the drain electrode 14 are then formed by using a known process technique. A part of the source electrode 12 is embedded in the contact trench region 22y. The MOSFET 100 shown in FIGS. 1 to 4 is manufactured by the above manufacturing method.

Next, the functions and effects of the semiconductor device of the first embodiment will be described.

The trench gate structure, in which the gate electrode 16 is provided in the trench 22, is applied to the MOSFET 100. The application of the trench gate structure increases a channel area per unit area and reduces the on-resistance of the MOSFET 100.

Moreover, the MOSFET 100 is provided with the contact region 12a which is a part of the source electrode 12 in the trench 22. The MOSFET 100 is a MOSFET having a so-called double trench structure. By providing the contact region 12a in the trench 22, electrical connection to the body region 28 and the source region 30 can be established on the side faces of the trench 22. Accordingly, the connection area of the source electrode 12 on the front face of the silicon carbide layer 10 can be reduced. Therefore, the channel area per unit area increases, and the on-resistance of the MOSFET 100 is reduced.

Furthermore, the MOSFET 100 includes the field limiting region 32 around the bottom face and side faces of the contact trench region 22y. Accordingly, the electric field applied to the gate insulating layer 18 is limited when the MOSFET 100 is turned off. Therefore, the reliability of the gate insulating layer 18 is improved.

Further, the MOSFET 100 includes the gate trench bottom region 34 on the bottom face of the gate trench region 22x. Accordingly, the electric field applied to the gate insulating layer 18 is limited when the MOSFET 100 is turned off. Therefore, the reliability of the gate insulating layer 18 is improved.

Each of the gate trench region 22x and the contact trench region 22y of the MOSFET 100 is a part of the same trench 22. Therefore, the gate trench region 22x and the contact trench region 22y can be simultaneously formed in the silicon carbide layer 10.

For example, when the trench having the gate electrode (hereinafter referred to as a gate trench) and the trench having the source electrode (hereinafter referred to as a contact trench) are formed separately, the distance between the gate trench and the contact trench varies due to misalignment.

When the distance between the gate trench and the contact trench varies, for example, the field limiting region around the contact trench may approach the channel region of the gate trench, possibly leading to the fluctuation of the threshold voltage of the MOSFET. From the viewpoint of avoiding the fluctuation of the threshold voltage of the MOSFET, if a margin for misalignment is increased, the distance between the gate trench and the contact trench increases in the design. Therefore, the channel area per unit area is reduced, and the on-resistance of the MOSFET is increased.

The gate trench region 22x and the contact trench region 22y of the MOSFET 100 can be simultaneously formed in the silicon carbide layer 10. Accordingly, no misalignment will occur so that there is no need to provide a margin for misalignment. Therefore, the channel area per unit area is increased, and the on-resistance is reduced.

In addition, the gate trench bottom region 34 is in contact with the field limiting region 32 at the bottom of the trench 22. Therefore, the electric potential of the gate trench bottom region 34 can be fixed at the electric potential of the source electrode 12 via the field limiting region 32.

If the electric potential of the gate trench bottom region 34 is not fixed, for example, the switching loss of the MOSFET increases or the short circuit capacity of the MOSFET decreases. By fixing the electric potential of the gate trench bottom region 34 at the electric potential of the source electrode 12, the switching loss of the MOSFET 100 is reduced, and the short circuit capacity of the MOSFET 100 is improved.

From the viewpoint of limiting the electric field applied to the gate insulating layer 18, the distance between the second plane P2 and the gate trench bottom region 34 is preferably longer than the distance between the second plane P2 and the field limiting region 32. In other words, the depth of the field limiting region 32 is preferably deeper than the depth of the gate trench bottom region 34.

The p-type impurity concentration in the gate trench bottom region 34 is, for example, preferably lower than the p-type impurity concentration in the field limiting region 32. In other words, the p-type impurity concentration in the field limiting region 32 is preferably higher than the p-type impurity concentration in the gate trench bottom region 34. The limitation of the electric field applied to the gate insulating layer 18 and the reduction of the contact resistance between the source electrode 12 and the field limiting region 32 are realized.

As shown in FIG. 4, the end (E1 in FIG. 4) of the field limiting region 32 in the first direction is, for example, preferably located closer to the gate electrode 16 than the end (E2 in FIG. 4) of the contact region 12a in the first direction. A short circuit between the source electrode 12 and the drift region 26 is suppressed. A leakage current between the source electrode 12 and the drift region 26 is suppressed.

As described above, according to the first embodiment, a MOSFET capable of reducing the on-resistance can be realized.

(Second Embodiment)

A semiconductor device of a second embodiment is different from the semiconductor device of the first embodiment in that it does not have a gate trench bottom region 34 (fifth silicon carbide region) of a p$^+$-type. Hereinafter, a part of the description overlapping with the contents of the first embodiment may be omitted.

The semiconductor device of the second embodiment is a vertical MOSFET 200 using silicon carbide. The MOSFET 200 is a MOSFET having a trench gate structure in which a gate electrode is provided in a trench. The MOSFET 200 is a MOSFET having a so-called double trench structure in which a source electrode is also provided in the trench. Moreover, the MOSFET 200 is an n-channel MOSFET using electrons as carriers.

Figure 12:
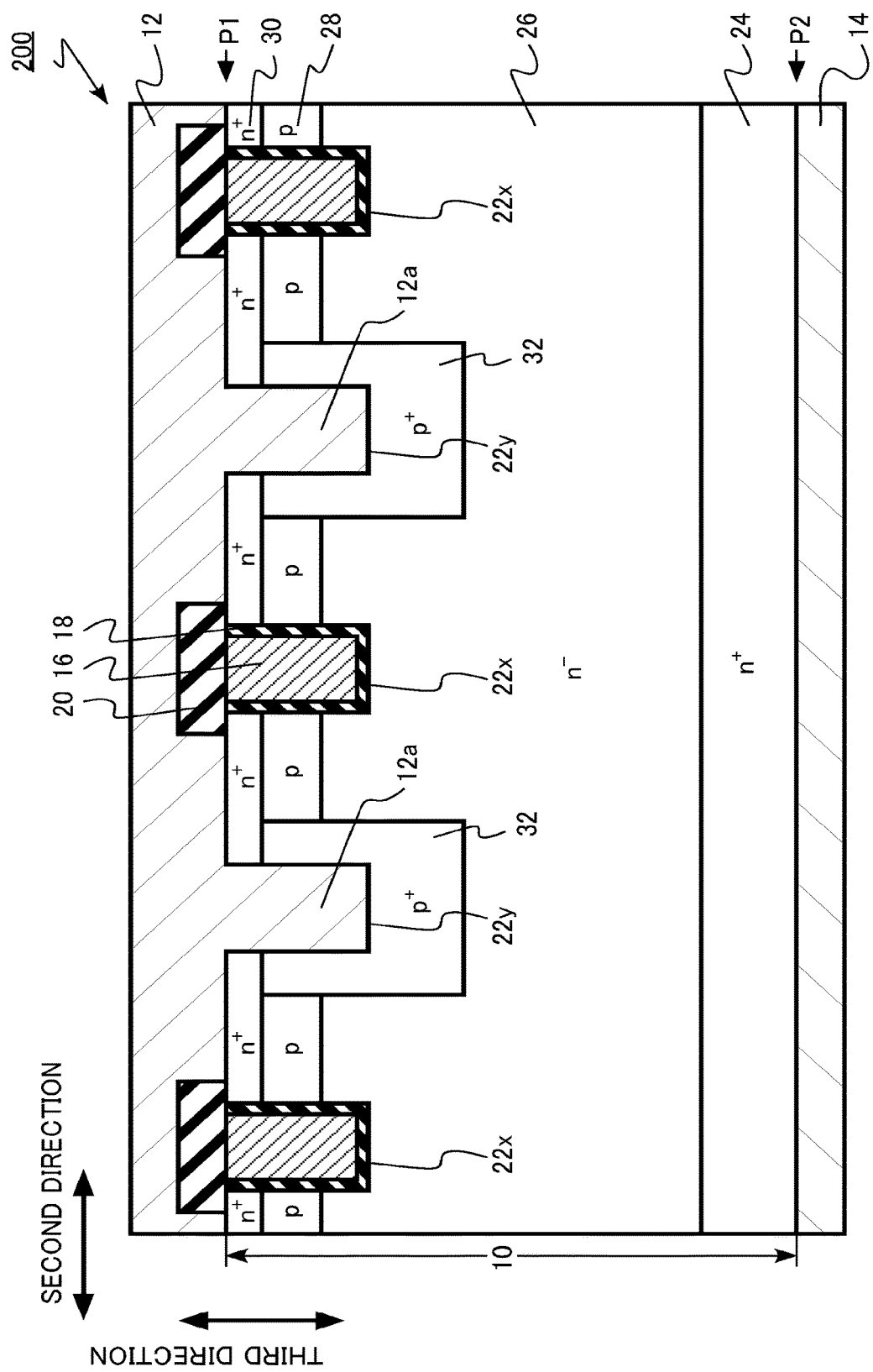
FIG. 12 is a schematic cross-sectional view of a semiconductor device of a second embodiment.

FIG. 12 is a schematic cross-sectional view of the semiconductor device of the second embodiment. FIG. 12 corresponds to FIG. 2 of the first embodiment.

Figure 13:
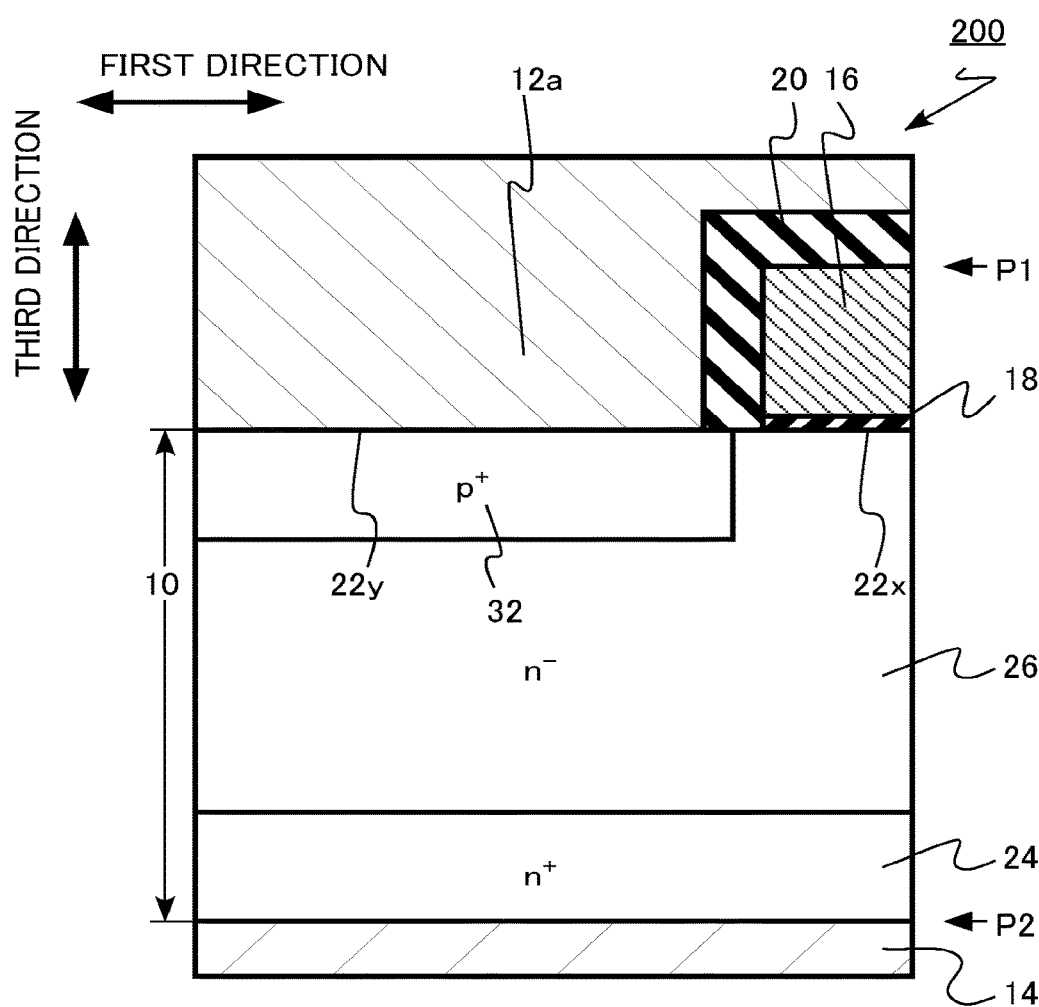
FIG. 13 is a schematic cross-sectional view of the semiconductor device of the second embodiment.

FIG. 13 is a schematic cross-sectional view of the semiconductor device of the second embodiment. FIG. 13 corresponds to FIG. 4 of the first embodiment.

The MOSFET 200 includes a silicon carbide layer 10, a source electrode 12 (first electrode), a drain electrode (second electrode), a gate electrode 16, a gate insulating layer 18 and an interlayer insulating layer 20.

The silicon carbide layer 10 has a trench 22, a drain region 24 of an n$^+$-type, a drift region 26 (first silicon carbide region) of an n$^-$-type, a body region 28 (second silicon carbide region) of a p-type, a source region 30 (third silicon carbide region) of the n$^+$-type and a field limiting region 32 (fourth silicon carbide region) of a p$^+$-type.

The trench 22 has a gate trench region 22x (first region) and a contact trench region 22y (second region). The source electrode 12 includes a contact region 12a (part) which is a part thereof.

The MOSFET 200 does not include a gate trench bottom region 34 (fifth silicon carbide region) of the p$^+$-type. The bottom face of the gate trench region 22x is in contact with the drift region 26. The bottom of the gate insulating layer 18 is in contact with the drift region 26.

As described above, according to the second embodiment, a MOSFET capable of reducing the on-resistance can be realized as in the first embodiment.

(Third Embodiment)

A semiconductor device of a third embodiment is different from the semiconductor device of the first embodiment in that the pattern of a gate trench region 22x (first region) and a contact trench region 22y (second region) is inverted from the pattern in the semiconductor device of the first embodiment. Hereinafter, a part of the description overlapping with the contents of the first embodiment may be omitted.

The semiconductor device of the third embodiment is a vertical MOSFET 300 using silicon carbide. The MOSFET 300 is a MOSFET having a trench gate structure in which a gate electrode is provided in a trench. The MOSFET 300 is a MOSFET having a so-called double trench structure in which a source electrode is also provided in the trench. Moreover, the MOSFET 300 is an n-channel MOSFET using electrons as carriers.

Figure 14:
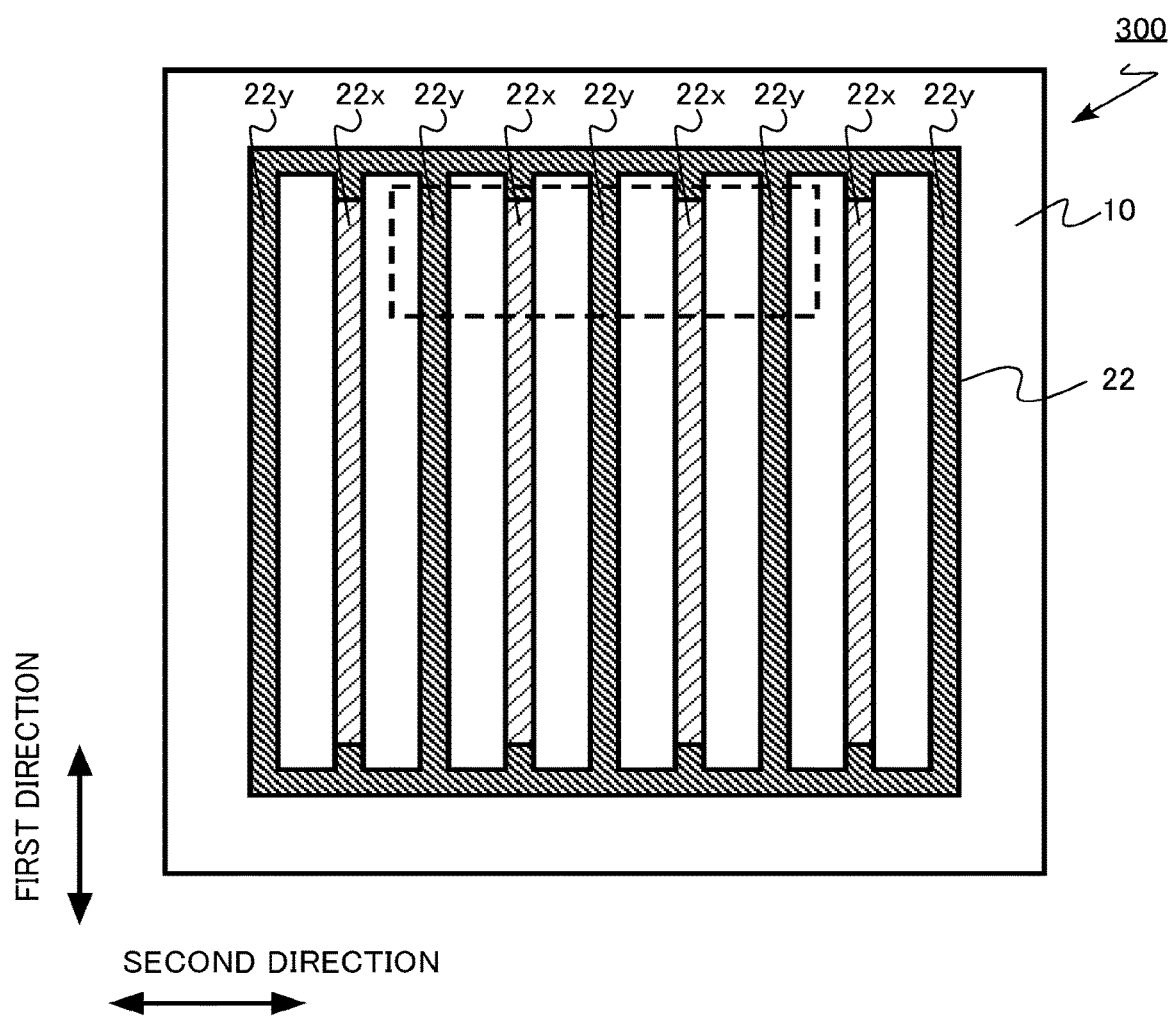
FIG. 14 is a schematic plan view of a semiconductor device of a third embodiment.

FIG. 14 is a schematic plan view of the semiconductor device of the third embodiment. FIG. 14 is an explanatory diagram of a trench pattern of the semiconductor device of the third embodiment.

Figure 15:
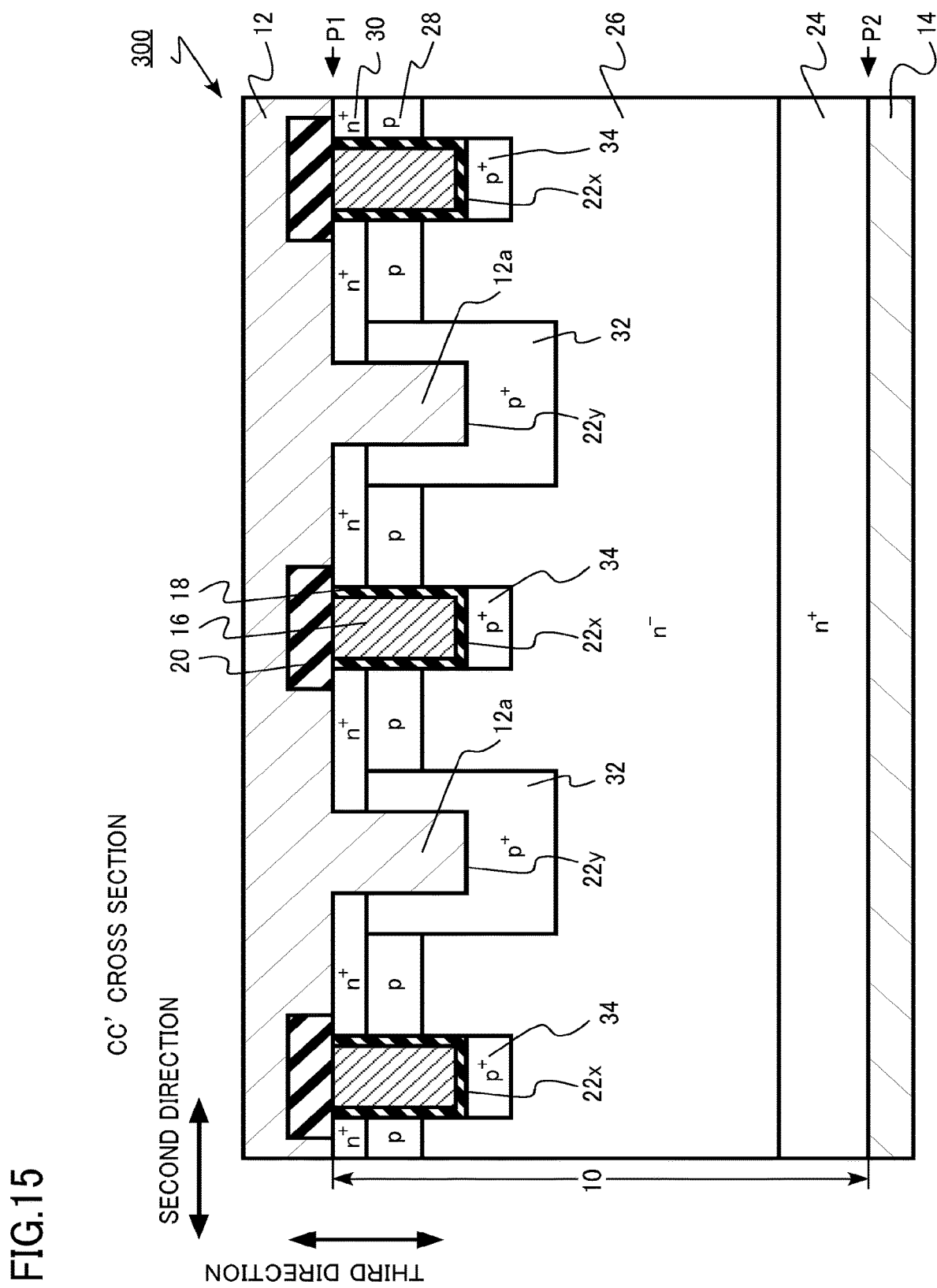
FIG. 15 is a schematic cross-sectional view of the semiconductor device of the third embodiment.
Figure 16:
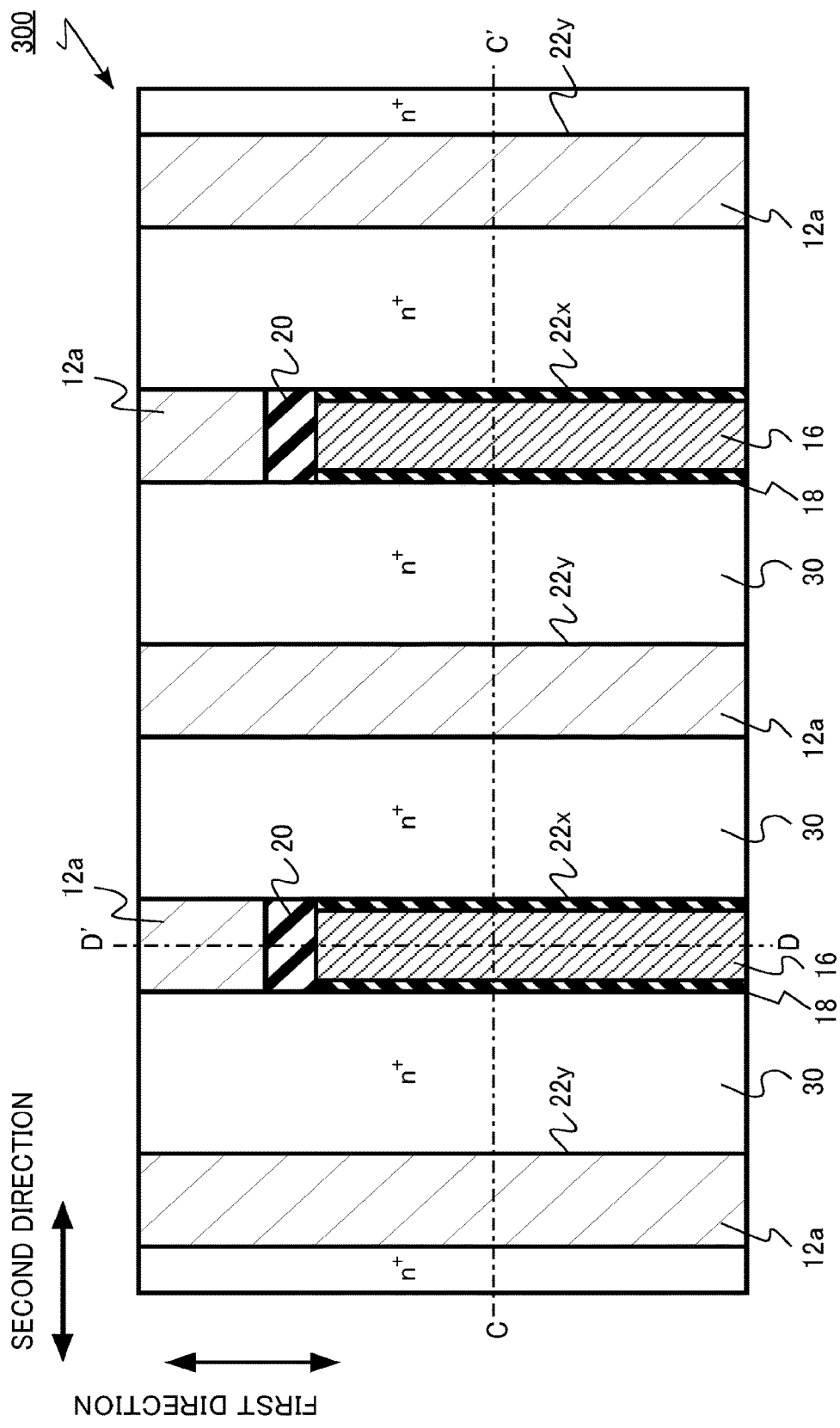
FIG. 16 is a schematic plan view of the semiconductor device of the third embodiment.
Figure 17:
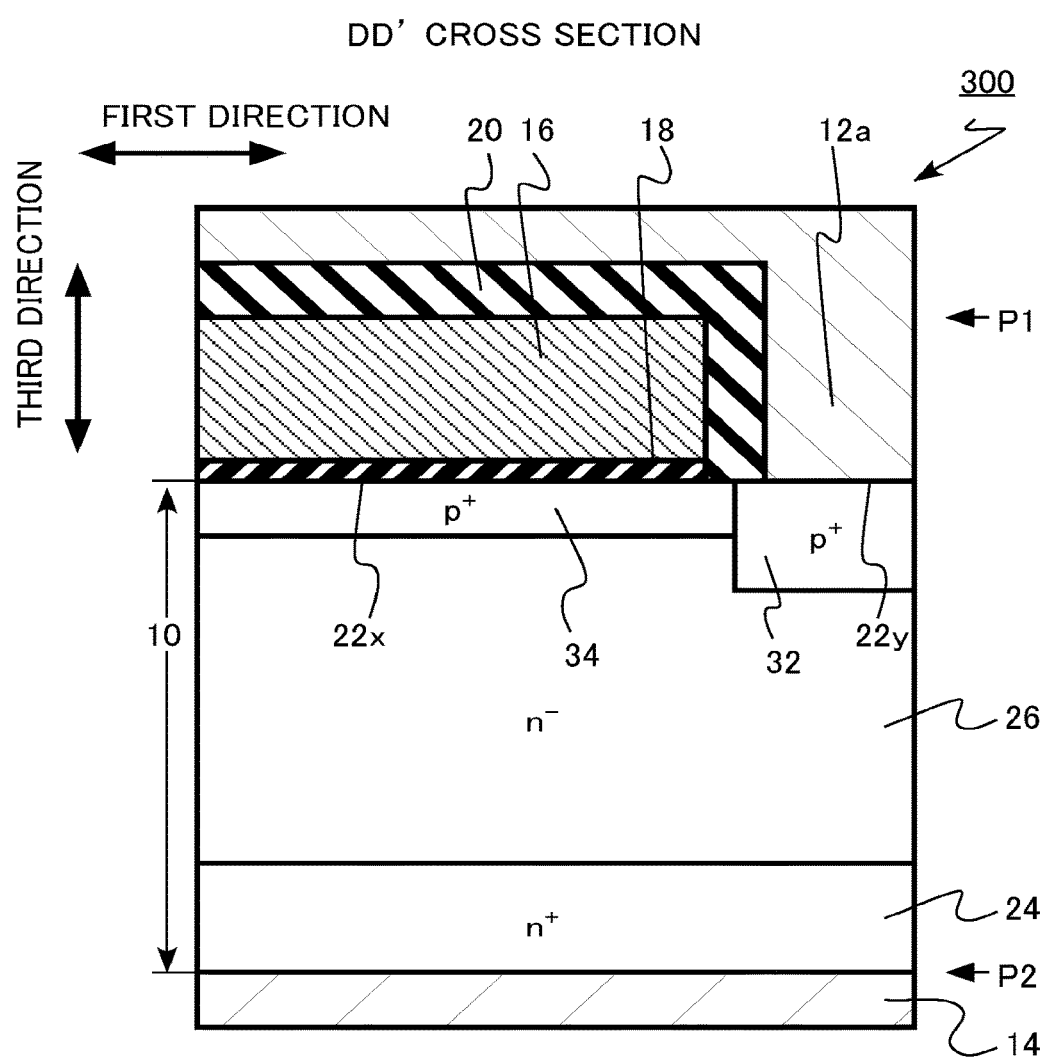
FIG. 17 is a schematic cross-sectional view of the semiconductor device of the third embodiment.

FIG. 15 is a schematic cross-sectional view of the semiconductor device of the third embodiment. FIG. 16 is a schematic plan view of the semiconductor device of the third embodiment. FIG. 17 is a schematic cross-sectional view of the semiconductor device of the third embodiment.

FIGS. 15, 16 and 17 are cross-sectional views or a plan view of a region indicated by the broken line in FIG. 14. FIGS. 14 and 16 are plan views of a first plane (P1 in FIG. 15) in FIG. 15. FIG. 15 is a cross-sectional view taken along the line CC' in FIG. 16. FIG. 17 is a cross-sectional view taken along the line DD' in FIG. 16.

The MOSFET 300 includes a silicon carbide layer 10, a source electrode 12 (first electrode), a drain electrode (second electrode), a gate electrode 16, a gate insulating layer 18 and an interlayer insulating layer 20.

The silicon carbide layer 10 has a trench 22, a drain region 24 of an n$^+$-type, a drift region 26 (first silicon carbide region) of an n$^-$-type, a body region 28 (second silicon carbide region) of a p-type, a source region 30 (third silicon carbide region) of the n$^+$-type, a field limiting region 32 (fourth silicon carbide region) of a p$^+$-type and a gate trench bottom region 34 (fifth silicon carbide region) of the p$^+$-type.

The trench 22 has a gate trench region 22x (first region) and a contact trench region 22y (second region). The source electrode 12 includes a contact region 12a (part) which is a part thereof.

As shown in FIG. 14, the pattern of the gate trench region 22x (first region) and the contact trench region 22y (second region) of the MOSFET 300 is inverted from the pattern of the gate trench region 22x (first region) and the contact trench region 22y (second region) of the MOSFET 100 shown in FIG. 1.

As described above, according to the third embodiment, a MOSFET capable of reducing the on-resistance can be realized as in the first embodiment.

(Fourth Embodiment)

A semiconductor device of a fourth embodiments is different from the semiconductor device of the first embodiment in that a trench is shaped in lattice, and the trench has a portion parallel to the first direction and a portion parallel to the second direction on the first plane. Hereinafter, a part of the description overlapping with the contents of the first embodiment may be omitted.

The semiconductor device of the fourth embodiment is a vertical MOSFET 400 using silicon carbide. The MOSFET 400 is a MOSFET having a trench gate structure in which a gate electrode is provided in the trench. The MOSFET 400 is a MOSFET having a so-called double trench structure in which a source electrode is also provided in the trench. Moreover, the MOSFET 400 is an n-channel MOSFET using electrons as carriers.

Figure 18:
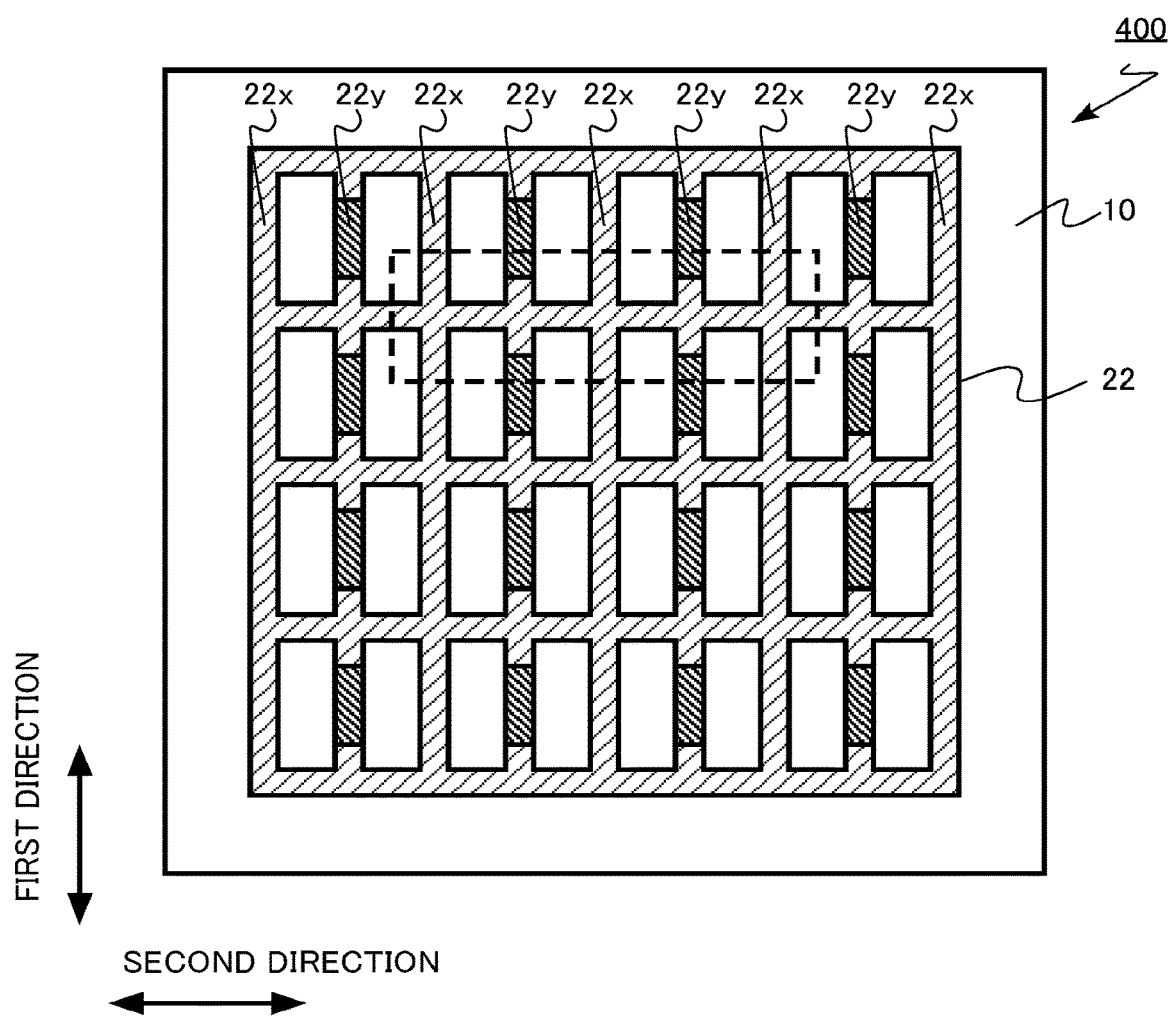
FIG. 18 is a schematic plan view of a semiconductor device of a fourth embodiment.

FIG. 18 is a schematic plan view of the semiconductor device of the fourth embodiment. FIG. 18 is an explanatory diagram of a trench pattern of the semiconductor device of the fourth embodiment.

Figure 19:
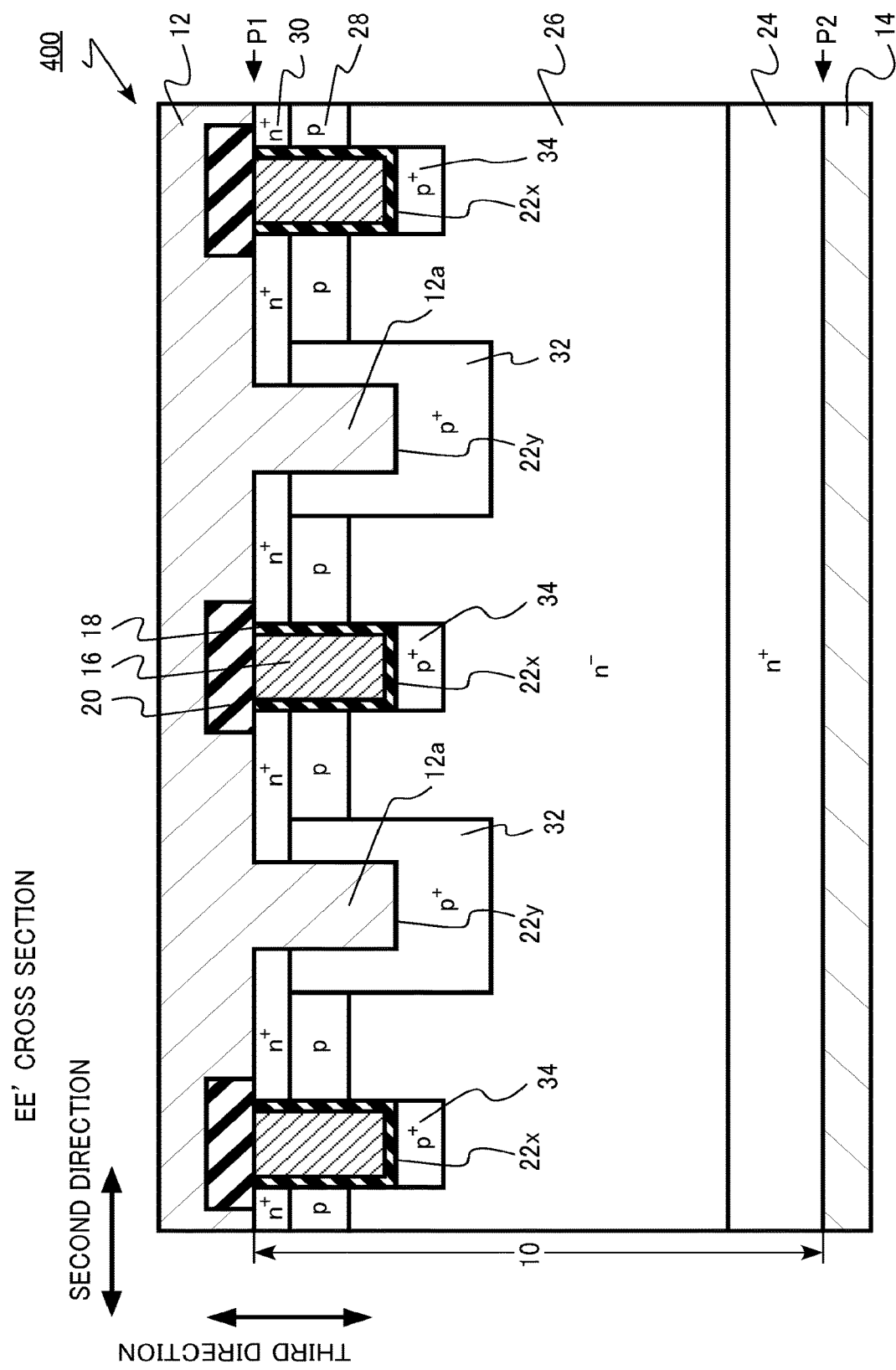
FIG. 19 is a schematic cross-sectional view of the semiconductor device of the fourth embodiment.
Figure 20:
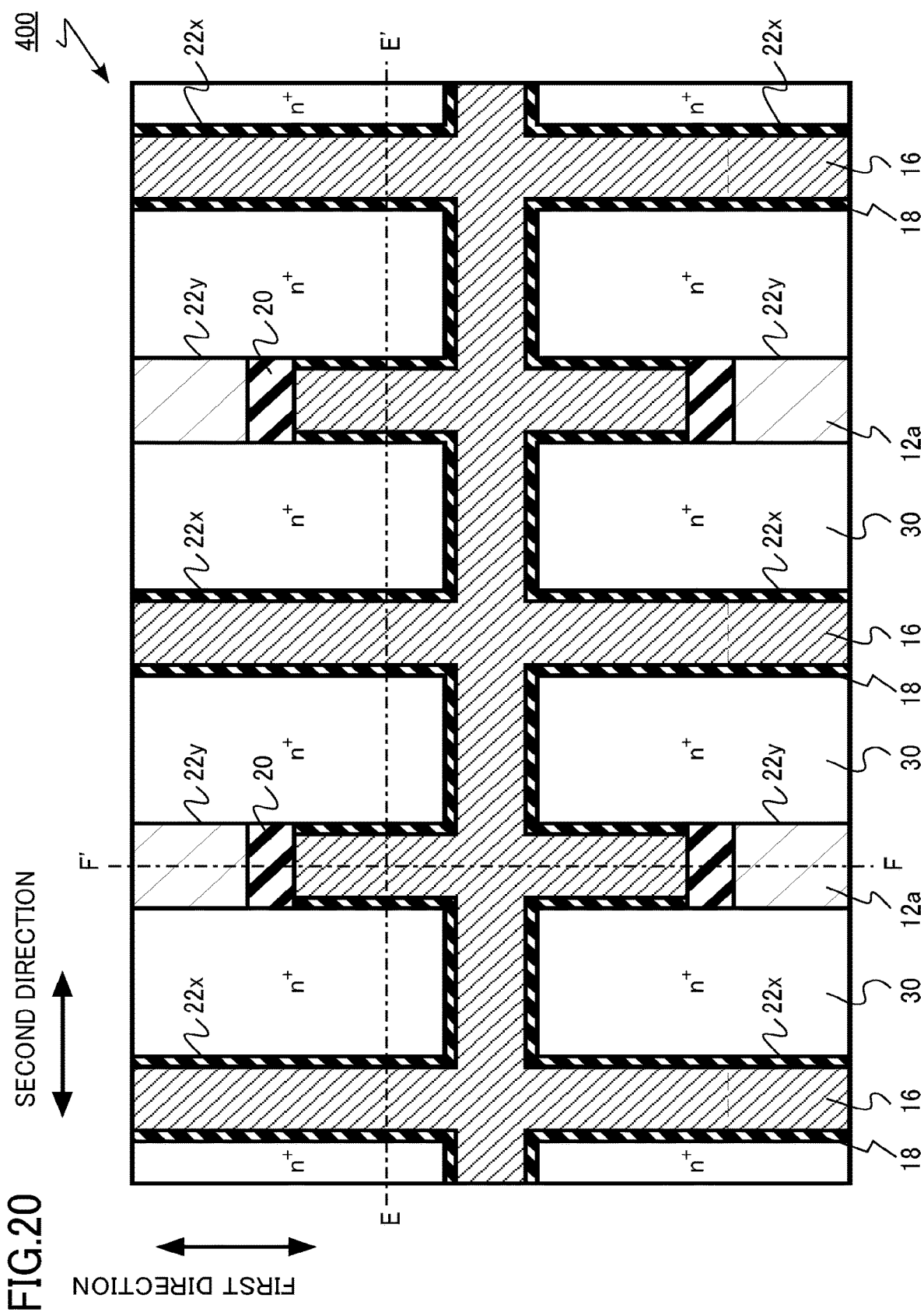
FIG. 20 is a schematic plan view of the semiconductor device of the fourth embodiment.
Figure 21:
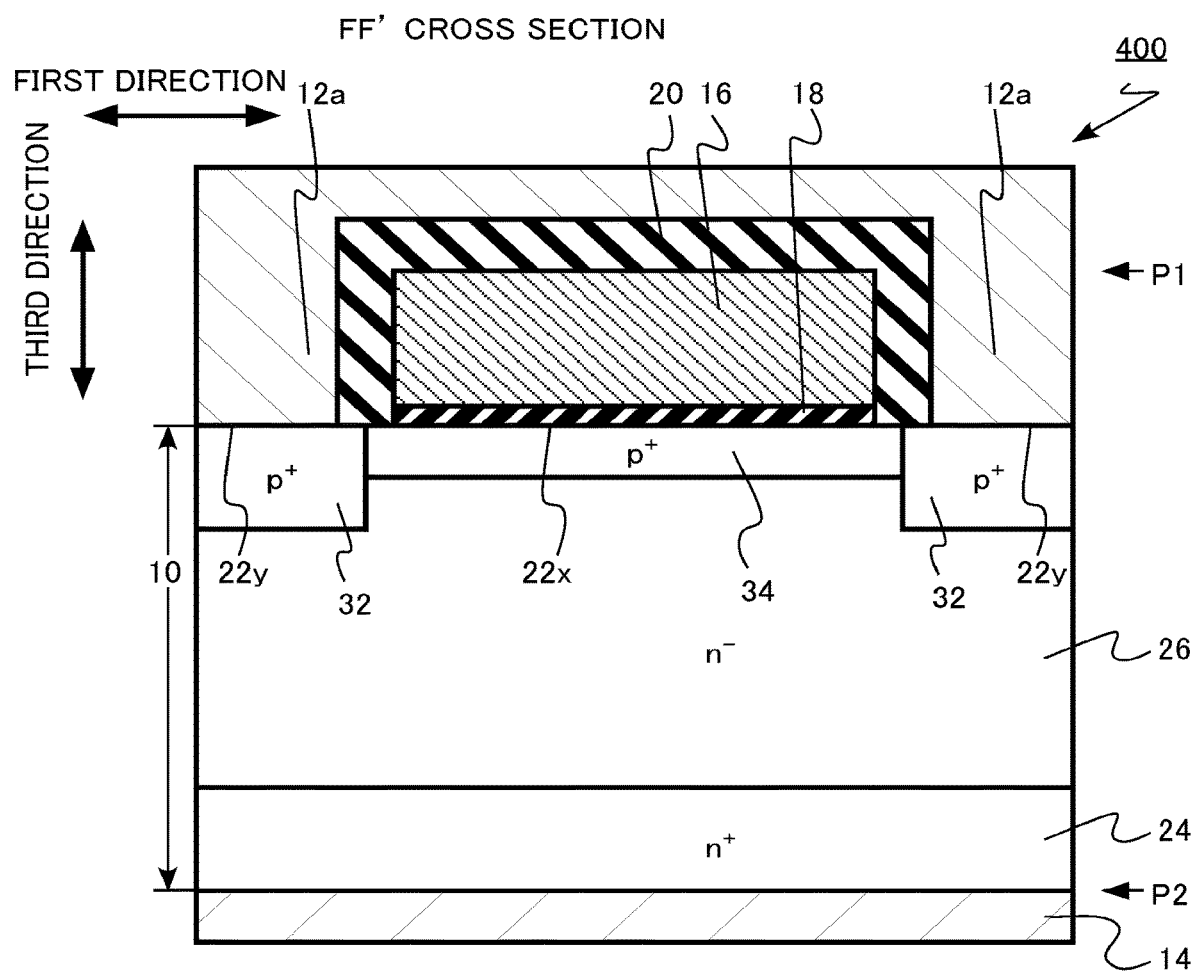
FIG. 21 is a schematic cross-sectional view of the semiconductor device of the fourth embodiment.

FIG. 19 is a schematic cross-sectional view of the semiconductor device of the fourth embodiment. FIG. 20 is a schematic plan view of the semiconductor device of the fourth embodiment. FIG. 21 is a schematic cross-sectional view of the semiconductor device of the fourth embodiment.

FIGS. 19, 20 and 21 are cross-sectional views or a plan view of a region indicated by the broken line in FIG. 18. FIGS. 18 and 20 are plan views of a first plane (P1 in FIG. 19) in FIG. 19. FIG. 19 is a cross-sectional view taken along the line EE' in FIG. 20. FIG. 21 is a cross-sectional view taken along the line FF' in FIG. 20.

The MOSFET 400 includes a silicon carbide layer 10, a source electrode 12 (first electrode), a drain electrode 14 (second electrode), a gate electrode 16, a gate insulating layer 18 and an interlayer insulating layer 20.

The silicon carbide layer 10 has a trench 22, a drain region 24 of an n'-type, a drift region 26 (first silicon carbide region) of an n$^-$-type, a body region 28 (second silicon carbide region) of a p-type, a source region 30 (third silicon carbide region) of the n$^+$-type, a field limiting region 32 (fourth silicon carbide region) of a p$^+$-type and a gate trench bottom region 34 (fifth silicon carbide region) of the p$^+$-type.

The trench 22 has a gate trench region 22x (first region) and a contact trench region 22y (second region). The source electrode 12 includes a contact region 12a (part) which is a part thereof.

As shown in FIGS. 18 and 20, the trench 22 of the MOSFET 400 is shaped in lattice. One portion of the trench 22 is parallel to the first direction and another portion of the trench 22 is parallel to the second direction on the first plane P1. The One portion of the trench 22 intersects with the another portion of the trench 22. The interval at which the trench 22 intersects is, for example, not less than 5 µm and not more than 50 µm.

Shaping the trench 22 in lattice enables a layout in which the distance between the field limiting region 32 at the bottom of the contact trench region 22y and the gate trench bottom region 34 at the bottom of the gate trench region 22x is shortened, compared with the case of being shaped in stripe. Accordingly, the electric potential of the gate trench bottom region 34 can be securely fixed at the electric potential of the source electrode 12. Therefore, the switching loss of the MOSFET 400 is reduced, and the short circuit capacity of the MOSFET 400 is improved.

As described above, according to the fourth embodiment, a MOSFET capable of reducing the on-resistance can be realized as in the first embodiment.

(Fifth Embodiment)

A semiconductor device of a fifth embodiment is different from the semiconductor device of the fourth embodiment in that the pattern of a gate trench region 22$x$ (first region) and a contact trench region 22$y$ (second region) is inverted from the pattern in the semiconductor device of the fourth embodiment. Hereinafter, a part of the description overlapping with the contents of the first or fourth embodiment may be omitted.

The semiconductor device of the fifth embodiment is a vertical MOSFET 500 using silicon carbide. The MOSFET 500 is a MOSFET having a trench gate structure in which a gate electrode is provided in a trench. The MOSFET 500 is a MOSFET having a so-called double trench structure in which a source electrode is also provided in the trench. Moreover, the MOSFET 500 is an n-channel MOSFET using electrons as carriers.

Figure 22:
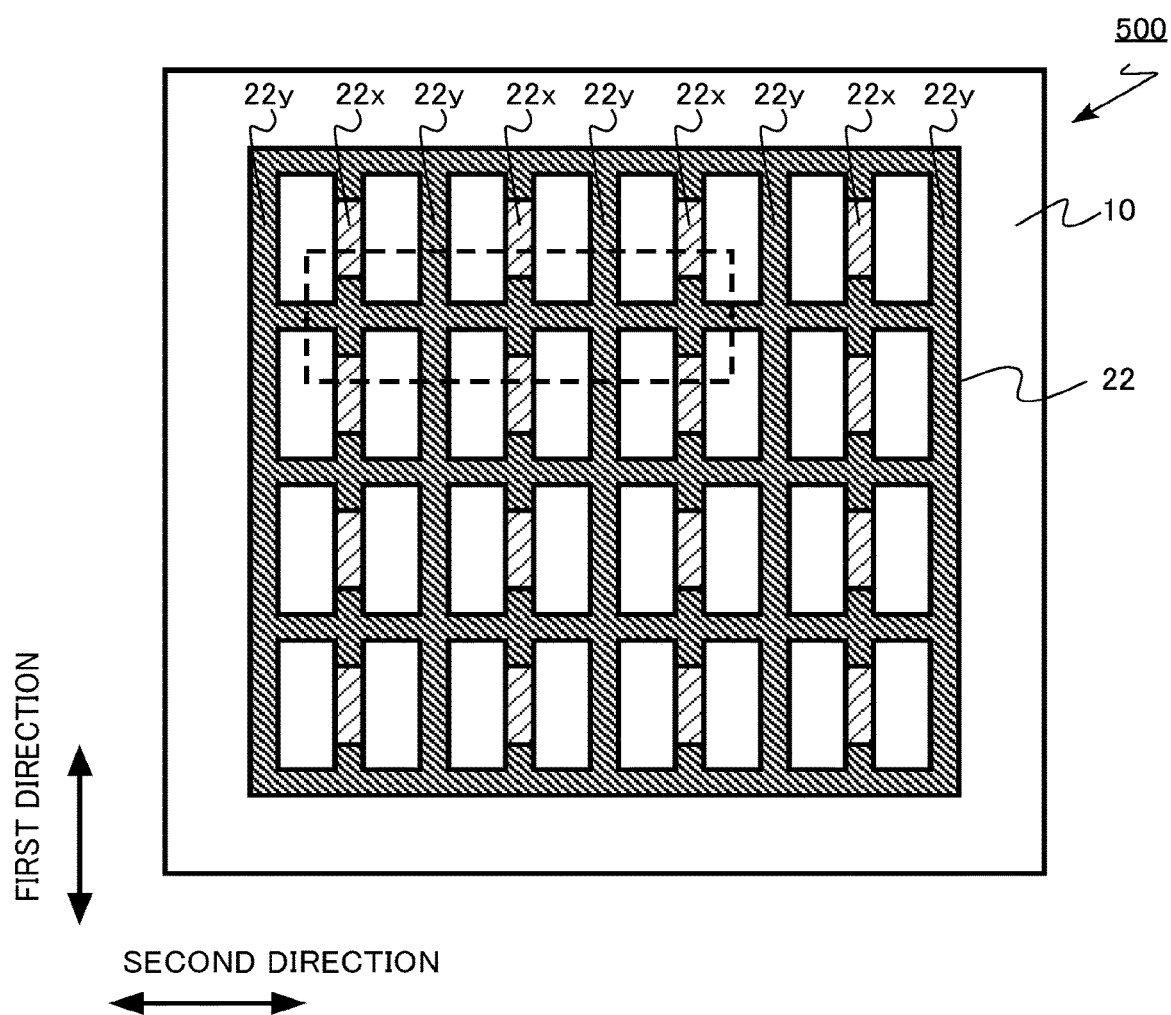
FIG. 22 is a schematic plan view of a semiconductor device of a fifth embodiment.

FIG. 22 is a schematic plan view of the semiconductor device of the fifth embodiment. FIG. 22 is an explanatory diagram of a trench pattern of the semiconductor device of the fifth embodiment.

Figure 23:
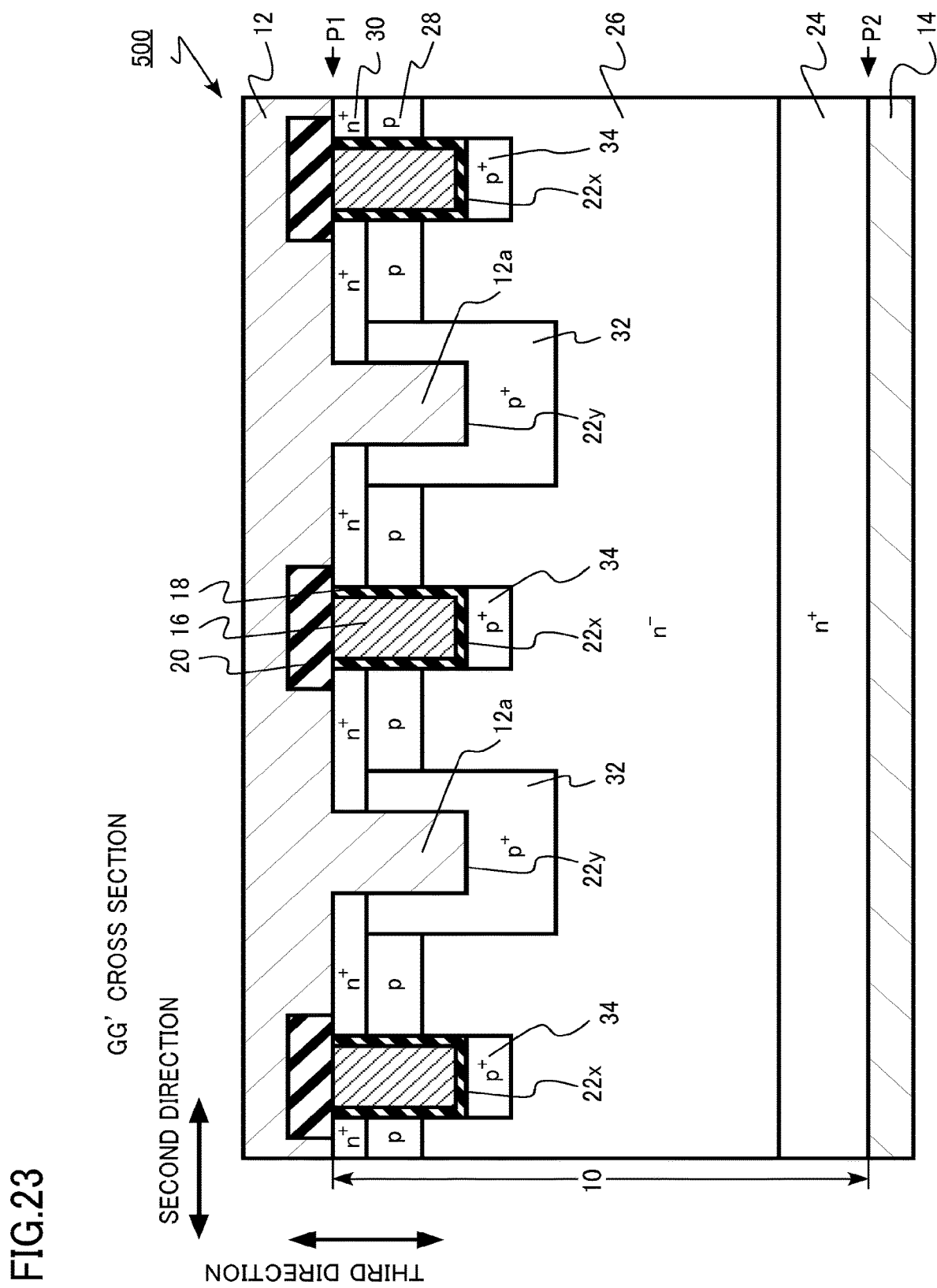
FIG. 23 is a schematic cross-sectional view of the semiconductor device of the fifth embodiment.
Figure 24:
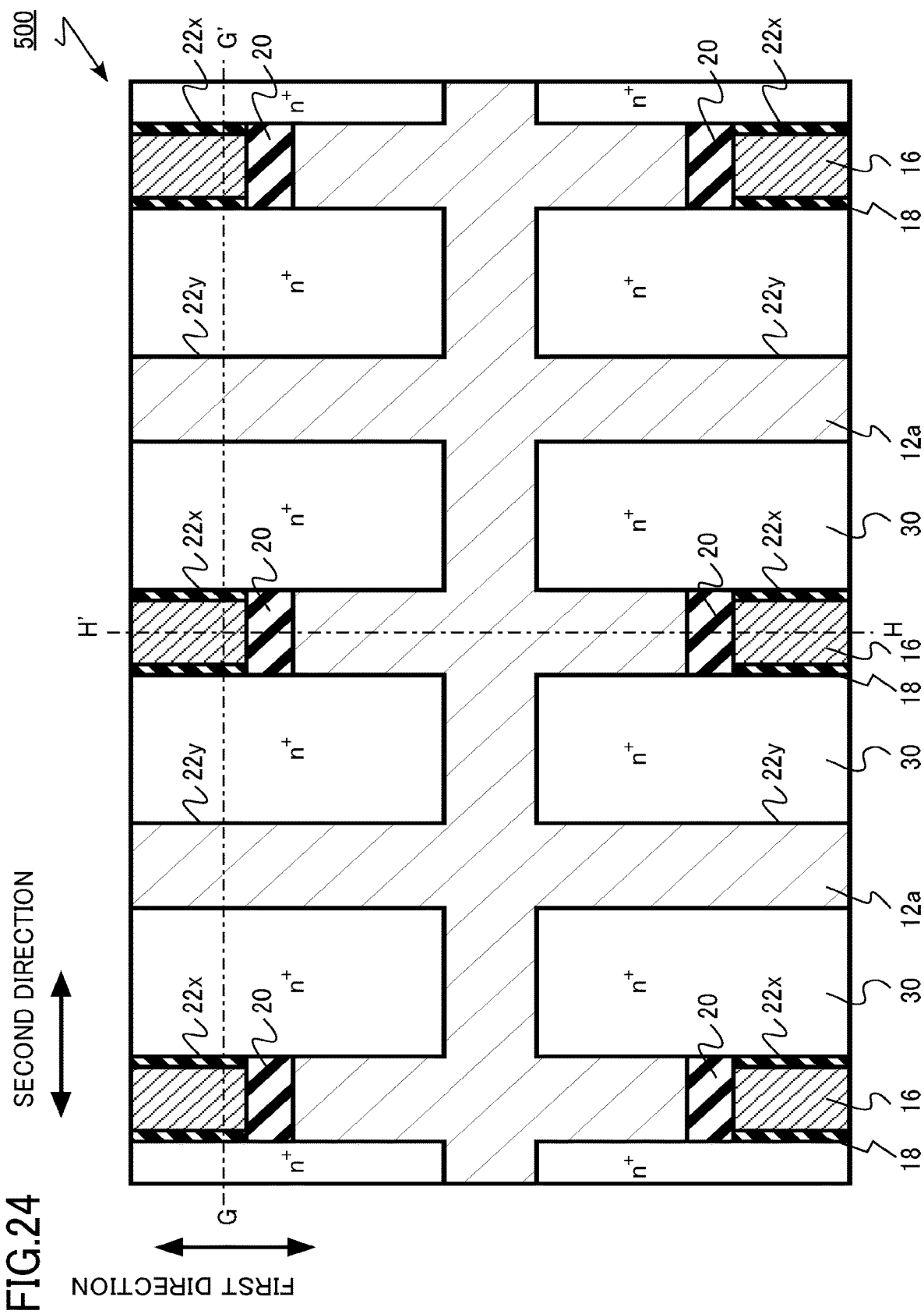
FIG. 24 is a schematic plan view of the semiconductor device of the fifth embodiment.
Figure 25:
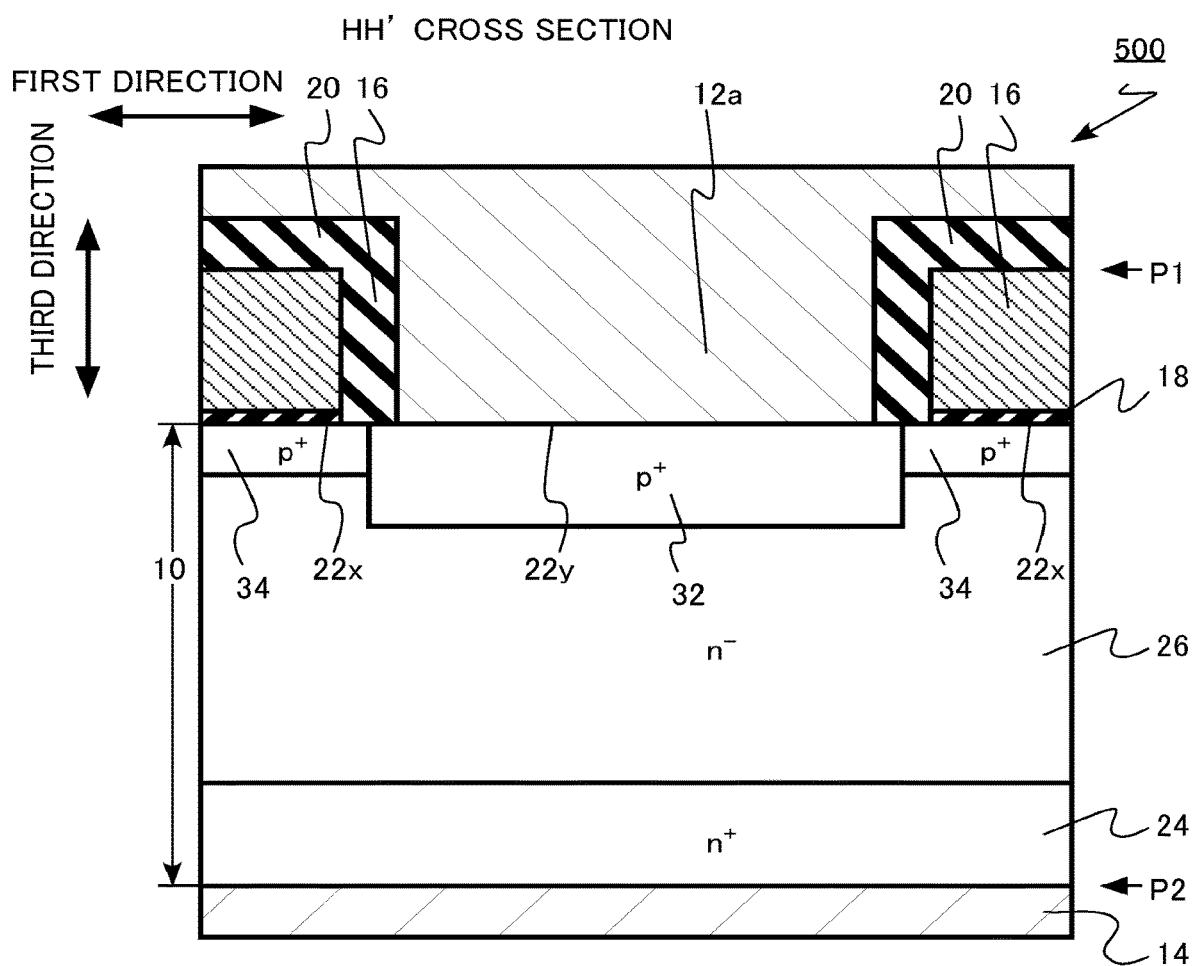
FIG. 25 is a schematic cross-sectional view of the semiconductor device of the fifth embodiment.

FIG. 23 is a schematic cross-sectional view of the semiconductor device of the fifth embodiment. FIG. 24 is a schematic plan view of the semiconductor device of the fifth embodiment. FIG. 25 is a schematic cross-sectional view of the semiconductor device of the fifth embodiment.

FIGS. 23, 24 and 25 are cross-sectional views or a plan views of a region indicated by the broken line in FIG. 22. FIGS. 22 and 24 are plan views of a first plane (P1 in FIG. 23) in FIG. 23. FIG. 23 is a cross-sectional view taken along the line GG' in FIG. 24. FIG. 25 is a cross-sectional view taken along the line HH' in FIG. 24.

The MOSFET 500 includes a silicon carbide layer 10, a source electrode 12 (first electrode), a drain electrode (second electrode), a gate electrode 16, a gate insulating layer 18 and an interlayer insulating layer 20.

The silicon carbide layer 10 has a trench 22, a drain region 24 of an n$^+$-type, a drift region 26 (first silicon carbide region) of an n$^-$-type, a body region 28 (second silicon carbide region) of a p-type, a source region 30 (third silicon carbide region) of the n$^+$-type, a field limiting region 32 (fourth silicon carbide region) of a p$^+$-type and a gate trench bottom region 34 (fifth silicon carbide region) of the p$^+$-type.

The trench 22 has a gate trench region 22$x$ (first region) and a contact trench region 22$y$ (second region). The source electrode 12 includes a contact region 12$a$ (part) which is a part thereof.

As shown in FIG. 22, the pattern of the gate trench region 22$x$ (first region) and the contact trench region 22$y$ (second region) of the MOSFET 500 is inverted from the pattern of the gate trench region 22$x$ (first region) and the contact trench region 22$y$ (second region) of the MOSFET 400 shown in FIG. 18.

As described above, according to the fifth embodiment, a MOSFET capable of reducing the on-resistance can be realized as in the first embodiment.

(Sixth Embodiment)

An inverter circuit and a driving device of a sixth embodiment are a driving device including the semiconductor device of the first embodiment.

Figure 26:
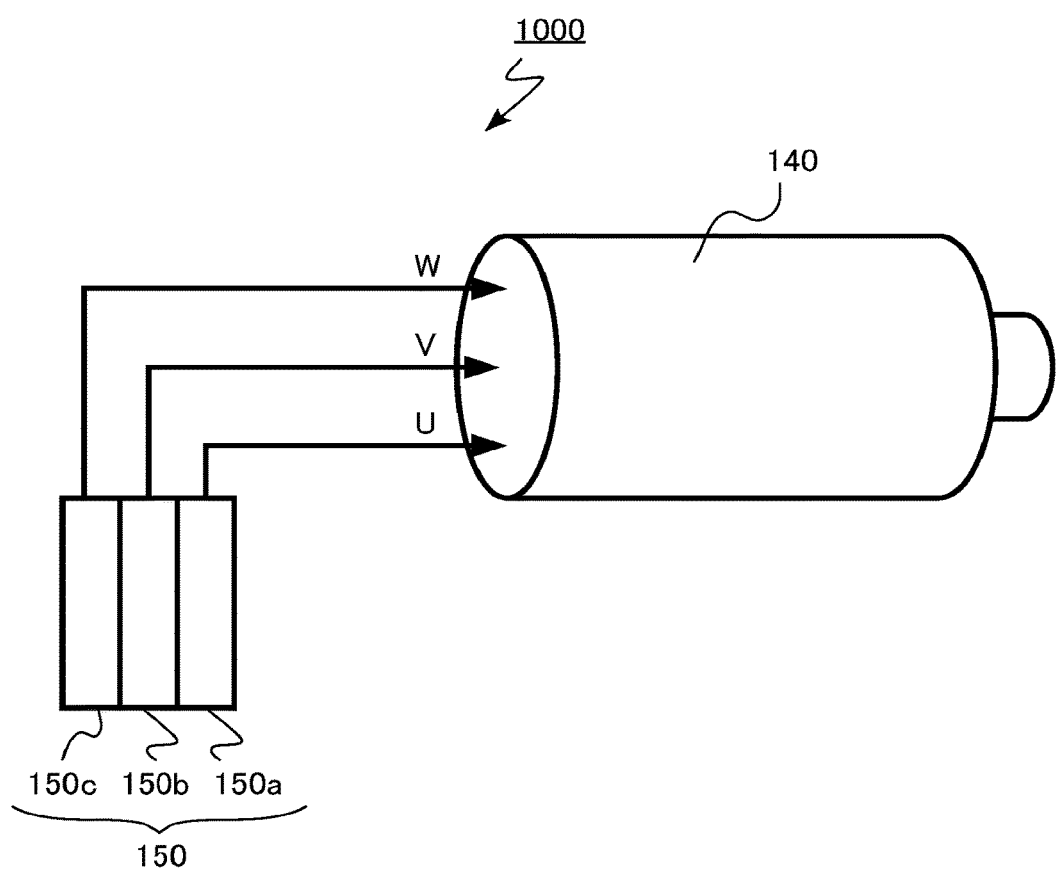
FIG. 26 is a schematic view of a driving device of a sixth embodiment.

FIG. 26 is a schematic view of the driving device of the sixth embodiment. A driving device 1000 includes a motor 140 and an inverter circuit 150.

The inverter circuit 150 includes three semiconductor modules 150$a$, 150$b$ and 150$c$ that use the MOSFET 100 of the first embodiment as a switching element. By connecting the three semiconductor modules 150$a$, 150$b$ and 150$c$ in parallel, the three-phase inverter circuit 150 including three AC voltage output terminals U, V and W is realized. The motor 140 is driven by the AC voltage outputted from the inverter circuit 150.

According to the sixth embodiment, the characteristics of the inverter circuit 150 and driving device 1000 are improved by including the MOSFET 100 with improved characteristics.

(Seventh Embodiment)

A vehicle of a seventh embodiment is a vehicle including the semiconductor device of the first embodiment.

Figure 27:
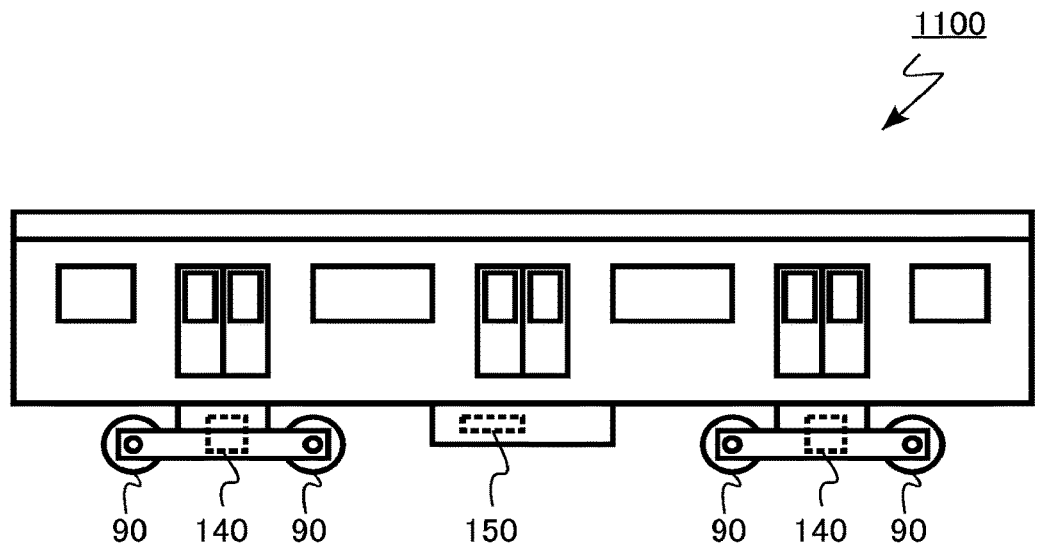
FIG. 27 is a schematic view of a vehicle of a seventh embodiment.

FIG. 27 is a schematic view of the vehicle of the seventh embodiment. A vehicle 1100 of the seventh embodiment is a railway vehicle. The vehicle 1100 includes motors 140 and an inverter circuit 150.

The inverter circuit 150 includes three semiconductor modules that use the MOSFET 100 of the first embodiment as a switching element. By connecting the three semiconductor modules in parallel, the three-phase inverter circuit 150 including three AC voltage output terminals U, V and W is realized. The motor 140 is driven by the AC voltage outputted from the inverter circuit 150. Wheels 90 of the vehicle 1100 are rotated by the motors 140.

According to the seventh embodiment, the characteristics of the vehicle 1100 are improved by including the MOSFET 100 with improved characteristics.

(Eighth Embodiment)

A vehicle of an eighth embodiment is a vehicle including the semiconductor device of the first embodiment.

Figure 28:
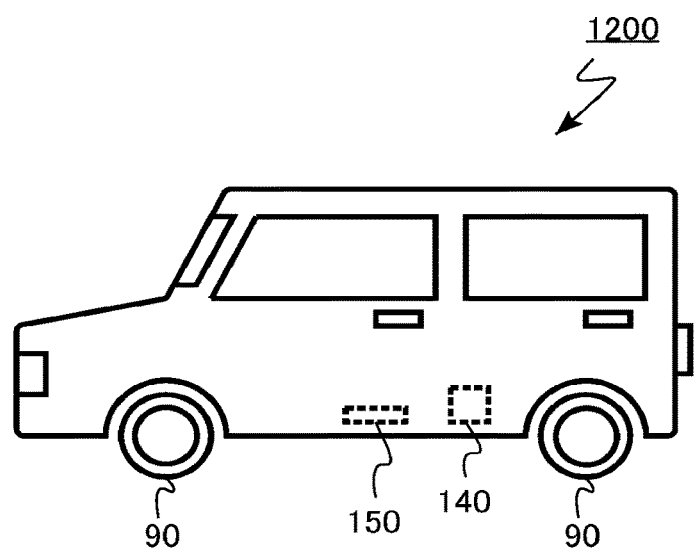
FIG. 28 is a schematic view of a vehicle of an eighth embodiment.

FIG. 28 is a schematic view of the vehicle of the eighth embodiment. A vehicle 1200 of the eighth embodiment is an automobile. The vehicle 1200 includes a motor 140 and an inverter circuit 150.

The inverter circuit 150 includes three semiconductor modules that use the MOSFET 100 of the first embodiment as a switching element. By connecting the three semiconductor modules in parallel, the three-phase inverter circuit 150 including three AC voltage output terminals U, V and W is realized.

The motor 140 is driven by the AC voltage outputted from the inverter circuit 150. Wheels 90 of the vehicle 1200 are rotated by the motor 140.

According to the eighth embodiment, the characteristics of the vehicle 1200 are improved by including the MOSFET 100 with improved characteristics.

(Ninth Embodiment)

An elevator of a ninth embodiment is an elevator including the semiconductor device of the first embodiment.

Figure 29:
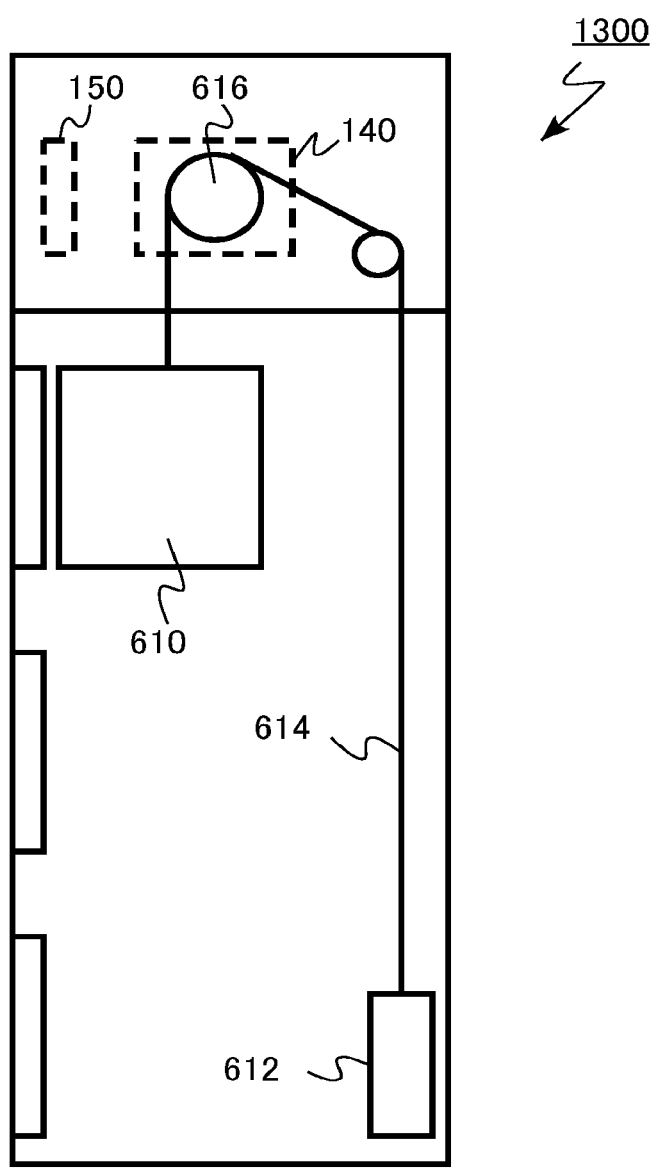
FIG. 29 is a schematic view of an elevator of a ninth embodiment.

FIG. 29 is a schematic view of the elevator of the ninth embodiment. An elevator 1300 of the ninth embodiment includes a car 610, a counterweight 612, a wire rope 614, a hoist 616, a motor 140 and an inverter circuit 150.

The inverter circuit 150 includes three semiconductor modules that use the MOSFET 100 of the first embodiment as a switching element. By connecting the three semiconductor modules in parallel, the three-phase inverter circuit 150 including three AC voltage output terminals U, V and W is realized.

The motor 140 is driven by the AC voltage outputted from the inverter circuit 150. The hoist 616 is rotated by the motor 140, and the car 610 is moved up or down.

According to the ninth embodiment, the characteristics of the elevator 1300 are improved by including the MOSFET 100 with improved characteristics.

In the first to fifth embodiments described above, the case where the crystal structure of silicon carbide is 4H-SiC has been described as an example. However, the present disclosure can also be applied to silicon carbide having other crystal structures such as 6H-SiC and 3C-SiC.

In the first to fifth embodiments, the case where the pattern of the trench 22 is shaped in stripe or lattice has been described as an example. However, if the pattern is such that the gate trench region 22x and the contact trench region 22y are parts of the same trench 22, other patterns are also possible.

Moreover, in the sixth to ninth embodiments, the case where the semiconductor device of the first embodiment is included has been described as an example. However, the semiconductor devices of the second to fifth embodiments can also be applied.

Furthermore, in the sixth to ninth embodiments, the case where the semiconductor device of the present disclosure is applied to vehicles or an elevator has been described as an example. However, the semiconductor device of the present disclosure can also be applied to, for example, a power conditioner of a solar power generation system, and the like.

While certain embodiments have been described, these embodiments have been presented by way of example only, and are not intended to limit the scope of the inventions. Indeed, the semiconductor devices, the inverter circuit, the driving device, the vehicles, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a silicon carbide layer having a first plane and a second plane, the first plane being parallel to a first direction and a second direction intersecting the first direction, and the second plane being parallel to the first direction and the second direction and facing the first plane, the silicon carbide layer comprising:
      a trench located on a first plane side, the trench having a first region and a second region, the first region and the second region having different compositions and being continuous in the first and second directions;
      a first silicon carbide region of an n-type;
      a second silicon carbide region of a p-type located between the first silicon carbide region and the first plane;
      a third silicon carbide region of the n-type located between the second silicon carbide region and the first plane; and
      a fourth silicon carbide region of the p-type located between the second region and the first silicon carbide region, the fourth silicon carbide region having p-type impurity concentration higher than p-type impurity concentration in the second silicon carbide region;
   a gate electrode located in the first region;
   a gate insulating layer located between the gate electrode and the silicon carbide layer;
   a first electrode located on the first plane side of the silicon carbide layer, a part of the first electrode being located in the second region, and the part of the first electrode being in contact with the third silicon carbide region and the fourth silicon carbide region; and
   a second electrode located on a second plane side of the silicon carbide layer.

2. The semiconductor device according to claim 1, wherein at least a part of the first region extends in the first direction, and at least a part of the second region extends in the first direction, and
   the second silicon carbide region is located between the at least a part of the first region and the at least a part of the second region.

3. The semiconductor device according to claim 1, wherein the trench is shaped in lattice, and the trench has a portion parallel to the first direction and a portion parallel to the second direction on the first plane.

4. The semiconductor device according to claim 1, wherein the fourth silicon carbide region is located between the second region and the second silicon carbide region.

5. The semiconductor device according to claim 1, further comprising an interlayer insulating layer located in a part of the trench extending in the first direction, the interlayer insulating layer located between the gate electrode and the part of the first electrode in the first direction, the interlayer insulating layer being thicker than a thickness of the gate insulating layer.

6. The semiconductor device according to claim 5, wherein a part of the fourth silicon carbide region is provided between the interlayer insulating layer located in the part of the trench and the first silicon carbide region in a third direction perpendicular to the first direction and the second direction.

7. The semiconductor device according to claim 1, wherein a distance between the second plane and the first region and a distance between the second plane and the second region are substantially same.

8. An inverter circuit comprising the semiconductor device according to claim 1.

9. A driving device comprising the semiconductor device according to claim 1.

10. A vehicle comprising the semiconductor device according to claim 1.

11. An elevator comprising the semiconductor device according to claim 1.

12. A semiconductor device comprising:
   a silicon carbide layer having a first plane and a second plane, the first plane being parallel to a first direction and a second direction intersecting the first direction, and the second plane being parallel to the first direction and the second direction and facing the first plane, the silicon carbide layer comprising:
      a trench located on a first plane side, the trench having a first region and a second region;
      a first silicon carbide region of an n-type;
      a second silicon carbide region of a p-type located between the first silicon carbide region and the first plane;
      a third silicon carbide region of the n-type located between the second silicon carbide region and the first plane; and
      a fourth silicon carbide region of the p-type located between the second region and the first silicon carbide region, the fourth silicon carbide region having p-type impurity concentration higher than p-type impurity concentration in the second silicon carbide region;

a gate electrode located in the first region;

a gate insulating layer located between the gate electrode and the silicon carbide layer;

a first electrode located on the first plane side of the silicon carbide layer, a part of the first electrode being located in the second region, and the part of the first electrode being in contact with the third silicon carbide region and the fourth silicon carbide region; and a second electrode located on a second plane side of the silicon carbide layer, wherein the silicon carbide layer has a fifth silicon carbide region of the p-type, the fifth silicon carbide region being located between the first region and the first silicon carbide region, the fifth silicon carbide region having Hype impurity concentration higher than p-type impurity concentration in the second silicon carbide region, and the fifth silicon carbide region being in contact with the fourth silicon carbide region.

13. The semiconductor device according to claim 12, wherein a distance between the second plane and the fifth silicon carbide region is longer than a distance between the second plane and the fourth silicon carbide region.

14. The semiconductor device according to claim 12, wherein the p-type impurity concentration in the fifth silicon carbide region is lower than p-type impurity concentration in the fourth silicon carbide region.

* * * * *